(12) United States Patent
Uh et al.

(10) Patent No.: US 11,569,206 B2
(45) Date of Patent: *Jan. 31, 2023

(54) INTEGRATED CIRCUIT CHIP, METHOD OF MANUFACTURING THE INTEGRATED CIRCUIT CHIP, AND INTEGRATED CIRCUIT PACKAGE AND DISPLAY APPARATUS INCLUDING THE INTEGRATED CIRCUIT CHIP

(71) Applicant: Samsung Electronics Co., Ltd., Suwon-si (KR)

(72) Inventors: Min-hee Uh, Gwacheon-si (KR); Sung-min Kang, Anyang-si (KR); Jun-gu Kang, Hwaseong-si (KR); Seung-hee Go, Seongnam-si (KR); Young-mok Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 70 days.

This patent is subject to a terminal disclaimer.

(21) Appl. No.: 17/338,630

(22) Filed: Jun. 3, 2021

(65) Prior Publication Data

US 2021/0296287 A1    Sep. 23, 2021

Related U.S. Application Data

(62) Division of application No. 16/548,406, filed on Aug. 22, 2019, now Pat. No. 11,049,846.

(30) Foreign Application Priority Data

Mar. 11, 2019   (KR) .......................... 10-2019-0027635

(51) Int. Cl.
  *H01L 23/48*   (2006.01)
  *H01L 23/52*   (2006.01)
  (Continued)

(52) U.S. Cl.
  CPC .......... *H01L 25/0657* (2013.01); *G09G 3/20* (2013.01); *H01L 21/76852* (2013.01);
  (Continued)

(58) Field of Classification Search
  CPC ............... H01L 25/50; H01L 21/76805; H01L 21/76898; H01L 25/0657
  See application file for complete search history.

(56) References Cited

U.S. PATENT DOCUMENTS 7,081,402 B2   7/2006 Hsu et al.
7,282,444 B2  10/2007 Tanida et al.
(Continued)

FOREIGN PATENT DOCUMENTS

KR        101050567 B1    7/2011
KR     1020120118363 A   10/2012
KR     1020180005588 A    1/2018

*Primary Examiner* — Brian Turner
(74) *Attorney, Agent, or Firm* — Muir Patent Law, PLLC

(57) ABSTRACT

An integrated circuit (IC) chip includes a via contact plug extending inside a through hole passing through a substrate and a device layer, a via contact liner surrounding the via contact plug, a connection pad liner extending along a bottom surface of the substrate, a dummy bump structure integrally connected to the via contact plug, and a bump structure connected to the connection pad liner. A method of manufacturing an IC chip includes forming an under bump metallurgy (UBM) layer inside and outside the through hole and forming a first connection metal layer, a second connection metal layer, and a third connection metal layer. The first connection metal layer covers the UBM layer inside the through hole, the second connection metal layer is integrally connected to the first connection metal layer, and the third connection metal layer covers the UBM layer on the connection pad liner.

8 Claims, 26 Drawing Sheets

(51) Int. Cl.
  *H01L 29/40* (2006.01)
  *H01L 23/495* (2006.01)
  *H01L 21/768* (2006.01)
  *H01L 25/065* (2006.01)
  *H01L 23/00* (2006.01)
  *H01L 25/00* (2006.01)
  *G09G 3/20* (2006.01)

(52) U.S. Cl.
  CPC ...... *H01L 21/76898* (2013.01); *H01L 23/481* (2013.01); *H01L 24/08* (2013.01); *H01L 24/14* (2013.01); *H01L 24/80* (2013.01); *H01L 25/50* (2013.01); *G09G 2310/0264* (2013.01); *H01L 2224/08145* (2013.01); *H01L 2224/145* (2013.01); *H01L 2224/14051* (2013.01); *H01L 2224/14517* (2013.01); *H01L 2224/80896* (2013.01); *H01L 2225/06524* (2013.01); *H01L 2225/06544* (2013.01); *H01L 2924/01079* (2013.01); *H01L 2924/1426* (2013.01); *H01L 2924/1431* (2013.01); *H01L 2924/1434* (2013.01)

(56) References Cited

U.S. PATENT DOCUMENTS

| | | | |
|---|---|---|---|
| 7,439,094 | B2 | 10/2008 | Song et al. |
| 7,524,763 | B2 | 4/2009 | Kim et al. |
| 8,766,103 | B2 | 7/2014 | Takahashi et al. |
| 8,791,567 | B2 | 7/2014 | Takahashi et al. |
| 9,793,165 | B2 | 10/2017 | Jeong et al. |
| 10,014,285 | B2 | 7/2018 | Kim et al. |
| 2010/0244251 | A1 | 9/2010 | Torazawa et al. |
| 2011/0266691 | A1 | 11/2011 | Lin et al. |
| 2012/0214302 | A1* | 8/2012 | Jeong .............. H01L 23/49827 257/E21.589 |
| 2014/0203394 | A1 | 7/2014 | Lin et al. |
| 2014/0353819 | A1 | 12/2014 | Chuang et al. |
| 2016/0126268 | A1 | 5/2016 | Inoue et al. |
| 2016/0183391 | A1 | 6/2016 | Kunard et al. |
| 2016/0190101 | A1 | 6/2016 | Yu et al. |
| 2017/0207240 | A1 | 7/2017 | He et al. |
| 2017/0358493 | A1 | 12/2017 | Fang et al. |
| 2018/0012069 | A1 | 1/2018 | Chung et al. |

\* cited by examiner

INTEGRATED CIRCUIT CHIP, METHOD OF MANUFACTURING THE INTEGRATED CIRCUIT CHIP, AND INTEGRATED CIRCUIT PACKAGE AND DISPLAY APPARATUS INCLUDING THE INTEGRATED CIRCUIT CHIP

CROSS-REFERENCE TO RELATED APPLICATION

This application is a Divisional application of U.S. patent application Ser. No. 16/548,406 filed on Aug. 22, 2019, now Allowed, which claims priority under 35 USC § 119 to Korean Patent Application No. 10-2019-0027635, filed on Mar. 11, 2019, in the Korean Intellectual Property Office, the disclosure of each of which is incorporated herein in its entirety by reference.

BACKGROUND

The inventive concept relates to an integrated circuit (IC) chip, a method of manufacturing the IC chip, and an IC package and display apparatus including the IC chip, and more particularly, to an IC chip including a contact structure configured to pass through a substrate, a method of manufacturing the IC chip, and an IC package and display apparatus including the IC chip.

In recent years, as portable electronic devices, such as smartphones, are required to be miniaturized and multifunctional, it is important to develop new structures and techniques for maintaining a small form factor and high reliability without increasing the size of electronic devices.

SUMMARY

The inventive concept provides an integrated circuit (IC) chip having a structure in which various ICs having different functions are three-dimensionally stacked to provide improved reliability and an IC package and display apparatus including the IC chip.

The inventive concept also provides a method of manufacturing an IC chip by three-dimensionally stacking various ICs having different functions using a simplified process to provide improved reliability.

According to an aspect of the inventive concept, there is provided an IC chip including an IC portion including a substrate and a device layer formed on the substrate, a via contact plug extending in a vertical direction inside a through hole passing through the substrate and the device layer, a via contact liner surrounding the via contact plug inside the through hole, a connection pad liner integrally connected to the via contact liner, the connection pad liner extending in a lateral direction along a bottom surface of the substrate, a dummy bump structure located outside the through hole and integrally connected to the via contact plug, and a bump structure connected to the connection pad liner at a position apart from the via contact plug and the dummy bump structure.

According to another aspect of the inventive concept, there is provided an IC chip including a first IC portion including a first substrate and a first device layer formed on the first substrate, a second IC portion including a second substrate and a second device layer formed on the second substrate, the second IC chip overlapping the first IC portion in a vertical direction, a through-via contact portion including a via contact plug extending in the vertical direction along a through hole passing through the second substrate and the second device layer, a connection pad liner connected to the through-via contact portion, the connection pad liner extending in a lateral direction along a bottom surface of the second substrate, a dummy bump structure protruding from one end of the through-via contact portion to an outside of the through hole, and a bump structure formed on the connection pad liner and located at a position spaced apart from the dummy bump structure in the lateral direction. The via contact plug, the dummy bump structure, and the bump structure include the same material as each other.

According to another aspect of the inventive concept, there is provided an IC chip including a first IC portion including a first substrate and a first device layer formed on the first substrate, a second IC portion including a second substrate spaced apart from the first substrate with the first device layer therebetween and a second device layer between the second substrate and the first device layer, a via contact plug extending in a vertical direction along a through hole passing through the second IC portion, a via contact liner surrounding an outer sidewall of the via contact plug inside the through hole, a connection pad liner integrally connected to the via contact liner, the connection pad liner extending in a lateral direction along a bottom surface of the second substrate, a dummy bump structure connected to the via contact plug, and a bump structure connected to the connection pad liner. The via contact plug, the dummy bump structure, and the bump structure include the same metal as each other.

According to another aspect of the inventive concept, there is provided an IC package including a support substrate, a plurality of conductive lines formed on the support substrate, and an IC chip mounted on the support substrate and configured to be electrically connected to the plurality of conductive lines. The IC chip is one of the IC chips according to the aspects of the inventive concept.

According to another aspect of the inventive concept, there is provided a display apparatus including a display driver IC (DDI) chip including one of the IC chips according to the aspects of the inventive concept, and a display panel configured to display display data via the control of the DDI chip.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
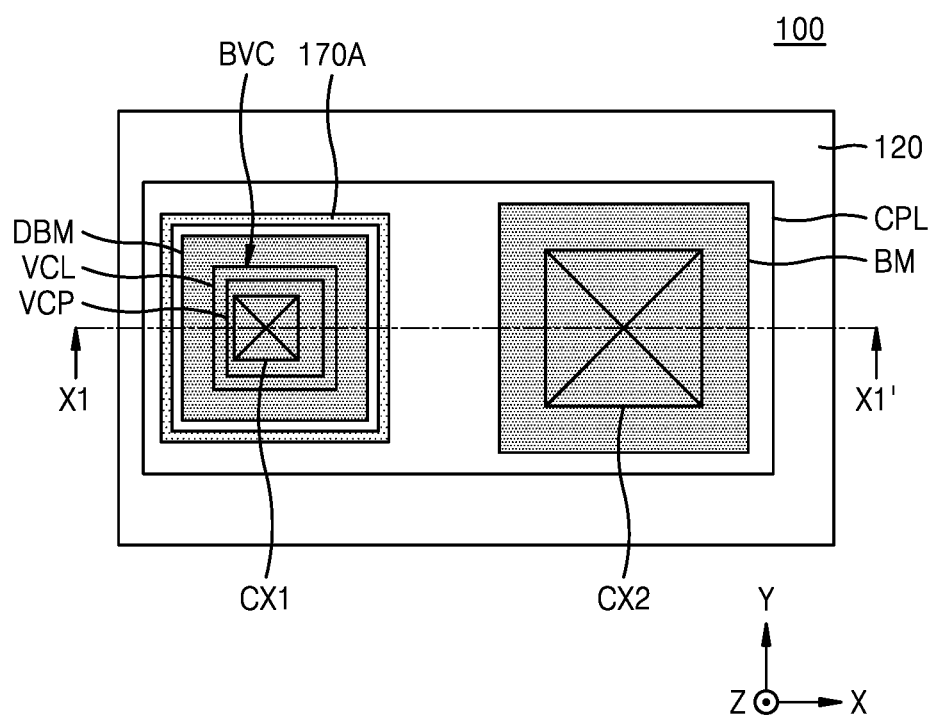
FIG. 1A is a plan view of a partial region of an integrated circuit (IC) chip according to example embodiments.

Hereinafter, example embodiments will be described in detail with reference to the accompanying drawings. The same reference numerals are used to denote the same reference elements, and repeated descriptions thereof will be omitted.

Figure 1B:
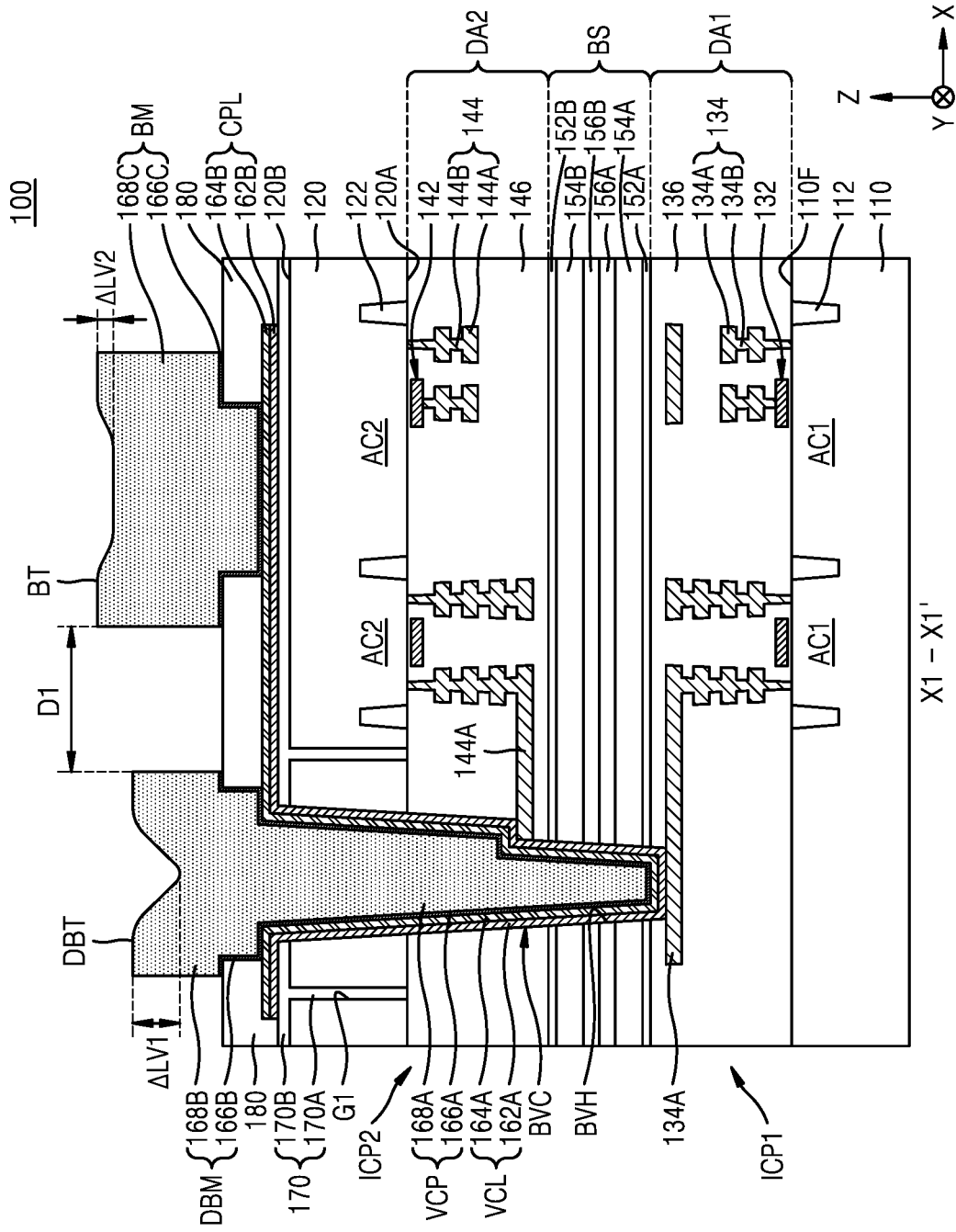
FIG. 1B is an enlarged cross-sectional view taken along a line X1-X1' of FIG. 1A.

FIG. 1A is a plan view of a partial region of an integrated circuit (IC) chip 100 according to example embodiments, and FIG. 1B is an enlarged cross-sectional view taken along a line X1-X1' of FIG. 1A.

As used herein, each of various IC chips may comprise a package which may include one or more chips stacked on a package substrate.

Referring to FIGS. 1A and 1B, the IC chip 100 may include a first IC portion ICP1 and a second IC portion ICP2, which are bonded to each other to overlap each other in a vertical direction (Z direction). The first IC portion ICP1 may include a first substrate 110 and a first device layer DA1 formed on an active surface 110F of the first substrate 110. The second IC portion ICP2 may include a second substrate 120 and a second device layer DA2 formed on an active surface 120A of the second substrate 120. The first substrate 110 and the second substrate 120 may be located opposite each other with the first device layer DA1 and the second device layer DA2 therebetween.

The first device layer DA1 and the second device layer DA2 each may include a plurality of various kinds of individual devices (e.g., individual devices 132 and 142). For example, the plurality of individual devices 132 and 142 included in the first device layer DA1 and the second device layer DA2 may include a metal-oxide-semiconductor field effect transistor (MOSFET) including a plurality of transistors, a system large-scale integration (LSI), a micro-electro-mechanical system (MEMS), an active device, or a passive device.

The plurality of individual devices 132 included in the first device layer DA1 may be formed on the active surface 110F of the first substrate 110. At least some of the plurality of individual devices 132 may be configured to be electrically connected to a plurality of first active regions AC1, which are defined in the first substrate 110, by a plurality of first device isolation films 112. In the first IC portion ICP1, the closer each of the plurality of first device isolation films 112 gets to the second IC portion ICP2, the greater a width of each of the plurality of first device isolation films 112 in a lateral direction (e.g., X direction) may become.

The plurality of individual devices 142 included in the second device layer DA2 may be formed on the active surface 120A of the second substrate 120. At least some of the plurality of individual devices 142 may be configured to be electrically connected to the plurality of second active regions AC2, which are defined in the second substrate 120, by a plurality of second device isolation films 122. In the second IC portion ICP2, the closer each of the plurality of second device isolation films 122 gets to the first IC portion ICP1, the greater a width of each of the plurality of second device isolation films 122 in the lateral direction (e.g., X direction) may become.

In the first device layer DA1 and the second device layer DA2, a plurality of multi-layered interconnection structures (e.g., 134 and 144) may be formed on the plurality of individual devices 132 and 142. The plurality of multi-layered interconnection structures 134 and 144 may include a plurality of interconnection layers (e.g., 134A and 144A) and a plurality of contact plugs (e.g., 134B and 144B). The plurality of interconnection layers 134A and 144A and the plurality of contact plugs 134B and 144B may include a metal layer and a conductive barrier film configured to surround a surface of the metal layer. The metal layer may include copper (Cu), tungsten (W), tantalum (Ta), titanium (Ti), cobalt (Co), manganese (Mn), aluminum (Al), or a combination thereof, and the conductive barrier film may include tantalum (Ta), titanium (Ti), tantalum (TaN), titanium (TiN), aluminum nitride (AlN), tungsten nitride (WN), or a combination thereof. In the plurality of multi-layered interconnection structures 134 and 144, the number of interconnection layers 134A and 144A, which are sequentially stacked in the vertical direction (Z direction), is not specifically limited but may be variously selected. The plurality of individual devices 132 and 142 and the plurality of multi-layered interconnection structures 134 and 144 may be insulated from each other by interlayer insulating films 136 and 146. The interlayer insulating films 136 and 146 may include a siliconoxide film, a siliconnitride film, a siliconoxynitride film, or a combination thereof.

In the first device layer DA1, the closer each of the plurality of interconnection layers 134A gets to the second IC portion ICP2, the greater a width of each of the plurality of interconnection layers 134A in the lateral direction (e.g., X direction) may become. In the second device layer DA2, the closer each of the plurality of interconnection layers 144A gets to the first IC portion ICP1, the greater a width of each of the plurality of interconnection layers 144A in the lateral direction (e.g., X direction) may become.

A bonding structure BS may be between the first IC portion ICP1 and the second IC portion ICP2. The bonding structure BS may include a silicon oxide film, a silicon nitride film, a silicon carbonitride film, a silicon carbide film, a polymer film, or a combination thereof. The polymer film may include polyimide, polyamide, polyacrylate, polyaramide, or a combination thereof. In some embodiments, the bonding structure BS may have a multi-layered structure including a plurality of silicon carbonitride (SiCN) films (e.g., 152A, 152B, 156A, and 156B) and a plurality of tetraethyl orthosilicate (TEOS) films (e.g., 154A and 154B). In the bonding structure BS, two SiCN films 156A and 156B, which are in contact with each other, may have a SiCN—SiCN mutual direct-bonded structure. The mutual direct-bonded structure of the SiCN films 156A and 156B may be the resultant structure obtained by performing a bonding process on a wafer-to-wafer level. A configuration of the bonding structure BS is not limited to the example shown in FIG. 1B and may be variously modified and changed. In some embodiments, the bonding structure BS may be omitted. In this case, the IC chip 100 may have a structure in which the first IC portion ICP1 is bonded to the second IC portion ICP2 by directly bonding the interlayer insulating film 136 to the interlayer insulating film 146.

The first IC portion ICP1 and the second IC portion ICP2 may perform different functions. In some embodiments, the first IC portion ICP1 may include a logic device, and the second IC portion ICP2 may include an analog device. In some embodiments, at least one of the first IC portion ICP1 and the second IC portion ICP2 may further include a memory device. For example, the first IC portion ICP1 may include the logic device and the memory device, and the second IC portion ICP2 may include the analog device. In some other embodiments, the first IC portion ICP1 may include the logic device, and the second IC portion ICP2 may include the analog device and the memory device. In some embodiments, the second IC portion ICP2 may include peripheral circuits, such as input/output devices I/O.

In some embodiments, the logic device may include various kinds of logic cells including a plurality of circuit elements, such as transistors and registers. The logic cell may constitute, for example, AND, NAND, OR, NOR, exclusive OR (XOR), exclusive NOR (XNOR), an inverter (INV), an adder (ADD), a buffer (BUF), a delay (DLY), a filter (FIL), a multiplexer(MXT/MXIT), OR/AND/IN-VERTER (OAI), AND/OR (AO), AND/OR/INVERTER (AOI), a D-flipflop, a reset flipflop, a master-slaver flipflop, or a latch. For example, the logic device may include logic circuits required for a display driver IC (DDI) used to drive pixels included in a display, such as a liquid crystal display (LCD) and a plasma display panel (PDP). The memory device may include flash memory, static random access memory (SRAM), dynamic RAM (DRAM), phase-change RAM (PRAM), resistive RAM (RRAM), magnetic RAM (MRAM), or a combination thereof.

In some embodiments, the first IC portion ICP1 may include low-voltage elements including low-voltage transistors to which a relatively low operating voltage is applied, and the second IC portion ICP2 may include high-voltage elements including high-voltage transistors to which a relatively high operating voltage is applied. In some examples, a high-voltage transistor may refer to a transistor of which an operating voltage is equal to or more than 1 V, and a low-voltage transistor may refer to a transistor of which an operating voltage is less than 1 V. In some examples, a high-voltage transistor may refer to a transistor of which an operating voltage is equal to or more than 3 V, and a low-voltage transistor may refer to a transistor of which an operating voltage is less than 3 V. In some other embodiments, the first IC portion ICP1 and the second IC portion ICP2 may include devices configured to operate in different operation modes. For example, the first IC portion ICP1 may include devices configured to operate in a low-power mode as compared with devices included in the second IC portion ICP2. The second IC portion ICP2 may include devices configured to operate in a high-power mode as compared with devices included in the first IC portion ICP1.

The IC chip 100 may include a through-via contact portion BVC, which extends in the vertical direction (Z direction) along a through hole BVH formed to pass through the first IC portion ICP1 and the bonding structure BS, and a dummy bump structure DBM, which protrudes from one end of the through-via contact portion BVC to the outside of the through the through hole BVH.

The through hole BVH may be formed to pass through the second substrate 120, the second device layer DA2, and the bonding structure BS from a backside (or, bottom) surface 120B of the second substrate 120. In some embodiments, the through hole BVH may be formed to partially pass through the interlayer insulating film 136 of the first device layer DA1 included in the first IC portion ICP1. In some embodiments, the through-via contact portion BVC may be connected to at least one of the plurality of interconnection layers 134A included in the first device layer DA1. In some other embodiments, the through-via contact portion BVC may be connected to at least one of the plurality of interconnection layers 144A included in the second device layer DA2. Although FIG. 1B illustrates an example in which the through-via contact portion BVC is connected to the interconnection layer 134A of the first device layer DA1 and the interconnection layer 144A of the second device layer DA2, the inventive concept is not limited thereto. For example, the through-via contact portion BVC may be configured to be connected to only the interconnection layer 134A of the first device layer DA1 or connected to only the interconnection layer 144A of the second device layer DA2.

The through-via contact portion BVC may include a via contact plug VCP, which passes through the second substrate 120, the second device layer DA2, and the bonding structure BS through the through hole BVH and extends in the vertical direction (Z direction), and a via contact liner VCL, which surrounds an outer sidewall of the via contact plug VCP inside the through hole BVH. The via contact liner VCL may be in contact with an inner surface of the through hole BVH and fill space between the inner surface of the through hole BVH and the via contact plug VCP.

The via contact plug VCP may include a first under bump metallurgy (UBM) layer 166A and a first connection metal layer 168A, which is in contact with the first UBM layer 166A and fills the inside of the through hole BVH on the first UBM layer 166A. The first UBM layer 166A may include Ti, W, TiW, or a combination thereof. The first connection metal layer 168A may include gold (Au).

The via contact liner VCL may include W, Al, Ti, TiN, or a combination thereof. The via contact liner VCL may include a first lower conductive layer 162A and a first upper conductive layer 164A, which may be sequentially stacked to conformally cover an inner surface of the through hole BVH. The first lower conductive layer 162A may be in contact with the interconnection layer 134A of the first device layer DA1 and the interconnection layer 144A of the second device layer DA2. In some embodiments, the first lower conductive layer 162A may include a W film, and the first upper conductive layer 164A may include an Al film. In some embodiments, each of the first lower conductive layer 162A and the first upper conductive layer 164A may further include a conductive barrier film, which may include Ti, TiN, or a combination thereof.

The bonding structure BS may surround a sidewall of the through-via contact portion BVC. The through-via contact portion BVC may pass through the bonding structure BS in the vertical direction (Z direction).

A connection pad liner CPL may extend on the backside surface 120B of the second substrate 120 along the backside surface 120B in a lateral direction (e.g., a direction parallel to an X-Y plane). The connection pad liner CPL may be connected to the through-via contact portion BVC. The connection pad liner CPL may be integrally connected to the via contact liner VCL included in the through-via contact portion BVC. The via contact liner VCL and the connection pad liner CPL may constitute a conductive liner, which may continuously extend from the inside of the through the through hole BVH to the outside of the through hole BVH.

The connection pad liner CPL may include W, Al, Ti, TiN, or a combination thereof. The connection pad liner CPL may include a second lower conductive layer 162B and a second upper conductive layer 164B, which are sequentially stacked on the backside surface 120B of the second substrate 120. The first lower conductive layer 162A of the via contact liner VCL may include the same material as the second lower conductive layer 162B of the connection pad liner CPL. The first upper conductive layer 164A of the via contact liner VCL may include the same material as the second upper conductive layer 164B of the connection pad liner CPL. The second lower conductive layer 162B may be integrally connected to the first lower conductive layer 162A. The second upper conductive layer 164B may be integrally connected to the first upper conductive layer 164A. The second lower conductive layer 162B may include a W film, and the second upper conductive layer 164B may include an Al film. In some embodiments, each of the second lower conductive layer 162B and the second upper conductive layer 164B may further include a conductive barrier film, which may include Ti, TiN, or a combination thereof.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

The dummy bump structure DBM may be located outside the through hole BVH and protrude from the backside surface 120B of the second substrate 120 to the outside of the second IC portion ICP2. The dummy bump structure DBM may be integrally connected to the via contact plug VCP. The dummy bump structure DBM may include a second UBM layer 166B and a second connection metal layer 168B, which is located on the second UBM layer 166B and in contact with the second UBM layer 166B. The second UBM layer 166B may include Ti, W, TiW, or a combination thereof. The second connection metal layer 168B may include Au. The first UBM layer 166A of the via contact plug VCP may include the same material as the second UBM layer 166B of the dummy bump structure DBM. The first connection metal layer 168A of the via contact plug VCP may include the same material as the second connection metal layer 168B of the dummy bump structure DBM.

A bump structure BM may be formed on the connection pad liner CPL. The bump structure BM may be in contact with a top surface of the connection pad liner CPL. The bump structure BM may be located apart from the backside surface 120B of the second substrate 120 with the connection pad liner CPL therebetween. The bump structure BM may be located at a position apart from the dummy bump structure DBM in a lateral direction (e.g., an X direction). A minimum distance D1 between the bump structure BM and the dummy bump structure DBM in the lateral direction may be greater than 0.

The bump structure BM may include a third UBM layer 166C and a third connection metal layer 168C, which may be located on the third UBM layer 166C and in contact with the third UBM layer 166C. The third UBM layer 166C may include Ti, W, TiW, or a combination thereof. The third connection metal layer 168C may include Au. The first UBM layer 166A of the via contact plug VCP, the second UBM layer 166B of the dummy bump structure DBM, and the third UBM layer 166C of the bump structure BM may include the same material. The first connection metal layer 168A of the via contact plug VCP, the second connection metal layer 168B of the dummy bump structure DBM, and the third connection metal layer 168C of the bump structure BM may include the same material.

In some embodiments, the first connection metal layer 168A of the via contact plug VCP, the second connection metal layer 168B of the dummy bump structure DBM, and the third connection metal layer 168C of the bump structure BM may include Au. For instance, the first connection metal layer 168A may include an Au plug, the second connection metal layer 168B may include a dummy Au bump, which is integrally connected to the Au plug, and the third connection metal layer 168C may include an Au bump, which is located at a position spaced apart from each of the Au plug and the dummy Au bump. In some other embodiments, the first connection metal layer 168A, the second connection metal layer 168B, and the third connection metal layer 168C may further include an additional metal in addition to gold (Au). The additional metal may include nickel (Ni), copper (Cu), praseodymium (Pr), or a combination thereof.

Herein, a dummy bump structure DBM is a structure formed at the same level as a bump structure BM (e.g., a level of the bottom surface of the dummy bump structure DBM is the same as a level of a bump structure BM) and adjacent to the bump structure BM. A dummy bump structure DBM is formed from the same conductive layers (e.g., UBM layer 166 and Au as shown in FIG. 15I) forming such bump structure BM. For example, a dummy bump structure DBM may be simultaneously formed with a bump structure BM with the same processes that deposit and pattern the conductive layers forming the bump structure BM. A dummy bump structure DBM in the IC chip 100 does not serve as an external terminal to cause transmission of a signal to an external device (e.g., a display panel 2300 shown in FIG. 14).

In FIG. 1A, reference numeral "CX1" denotes a contact region between the interconnection layer 134A of the first device layer DA1 and the through-via contact portion BVC, and reference numeral "CX2" denotes a contact region between the connection pad liner CPL and the bump structure BM.

A groove G1 may be formed in the second substrate 120 and surround at least a portion of the through-via contact portion BVC at a position spaced apart from the through-via contact portion BVC. The groove G1 may include a ring-shaped space, which may pass through the second substrate 120 and extend in the vertical direction (Z direction), at a position apart from the through-via contact portion BVC in the lateral direction (e.g., the direction parallel to the X-Y plane).

The IC chip 100 may include an insulating film 170, which fills the groove G1 and covers the backside surface 120B of the second substrate 120. The insulating film 170 may include a through insulating portion 170A, which fills the groove G1, and an insulating liner portion 170B, which covers the backside surface 120B of the second substrate 120. The through insulating portion 170A may surround at least a portion of the via contact liner VCL at a position apart from the through-via contact portion BVC in the lateral direction (e.g., a direction parallel to an X-Y plane). The insulating liner portion 170B may be disposed between the backside surface 120B of the second substrate 120 and the connection pad liner CPL. The insulating film 170 may include an aluminum oxide film or a hafnium oxide film. In some embodiments, at least a part of the through insulating portion 170A may include an air gap. As used herein, a term "air" may refer to the atmosphere or other gases that may be present during a manufacturing process. The through insulating portion 170A may pass through the second substrate 120 and extend in the vertical direction (Z direction) and have a ring-shaped planar structure. The through-via contact portion BVC may pass through the insulating liner portion 170B.

FIG. 1A illustrates an example in which each of the through-via contact portion BVC, the through insulating portion 170A, the dummy bump structure DBM, and the bump structure BM has a rectangular planar shape, but the inventive concept is not limited thereto. For example, each of the through-via contact portion BVC, the through insulating portion 170A, the dummy bump structure DBM, and the bump structure BM may have one of various planar shapes, such as a circular shape, an elliptical shape, and a polygonal shape.

The IC chip 100 may further include a passivation pattern 180 configured to cover the connection pad liner CPL on the backside surface 120B of the second substrate 120. The passivation pattern 180 may cover a partial region of the connection pad liner CPL between the dummy bump structure DBM and the bump structure BM. The passivation pattern 180 may include an oxide film, a nitride film, or a combination thereof, but is not limited thereto.

The backside surface 120B of the second substrate 120, a top surface DBT of the dummy bump structure DBM and a top surface BT of the bump structure BM may face the same direction.

In some embodiments, the top surface DBT of the dummy bump structure DBM may include a portion that is closer to the second substrate 120 than the top surface BT of the bump structure BM. The top surface DBT of the dummy bump structure DBM may have a concave shape, and the dummy bump structure DBM may include a portion that has a thickness smaller than the bump structure BM in the vertical direction (Z direction).

In some embodiments, the dummy bump structure DBM and the bump structure BM may have different top profiles. For example, a difference ALV1 between the uppermost level of the top surface DBT of the dummy bump structure DBM, which is farthest from the backside surface 120B of the second substrate 120, and the lowermost level of the top surface DBT of the dummy bump structure DBM, which is closest to the backside surface 120B of the second substrate 120, may be greater than a difference ALV2 between the uppermost level of the top surface BT of the bump structure BM, which is farthest from the backside surface 120B of the second substrate 120, and the lowermost level of the top surface BT of the bump structure BM, which is closest to the backside surface 120B of the second substrate 120. The uppermost level of the dummy bump structure DBM may be closer to the backside surface 120B of the second substrate 120 than the uppermost level of the bump structure BM in the vertical direction (Z direction). For example, a distance between the uppermost level of the dummy bump structure DBM and the backside surface 120B in the vertical direction may be less than a distance between the uppermost level of the bump structure BM and the backside surface 120B in the vertical direction.

In the IC chip 100, the first connection metal layer 168A included in the through-via contact portion BVC and the third connection metal layer 168C included in the bump structure BM may include the same metal. An inner space of the through-via contact portion BVC, which is surrounded by the via contact liner VCL, may be filled with not an insulating material but a metal so that the entire horizontal sectional area of the through-via contact portion BVC may be used as a conductive region. Accordingly, a resistance of the through-via contact portion BVC may be markedly reduced, and a tolerance of the IC chip 100 to physical stress may be increased to improve a physical strength of the IC chip 100. For example, when each of the first connection metal layer 168A and the third connection metal layer 168C includes Au, since Au has a lower resistivity than another metal (e.g., aluminum (Al) and tungsten (W)), a resistance of the through-via contact portion BVC may be further reduced. Therefore, the resistance of the through-via contact portion BVC configured to electrically connect the plurality of interconnection layers 134A and 144A to the outside in the IC chip 100 may be reduced to improve the reliability of the IC chip 100.

Figure 2:
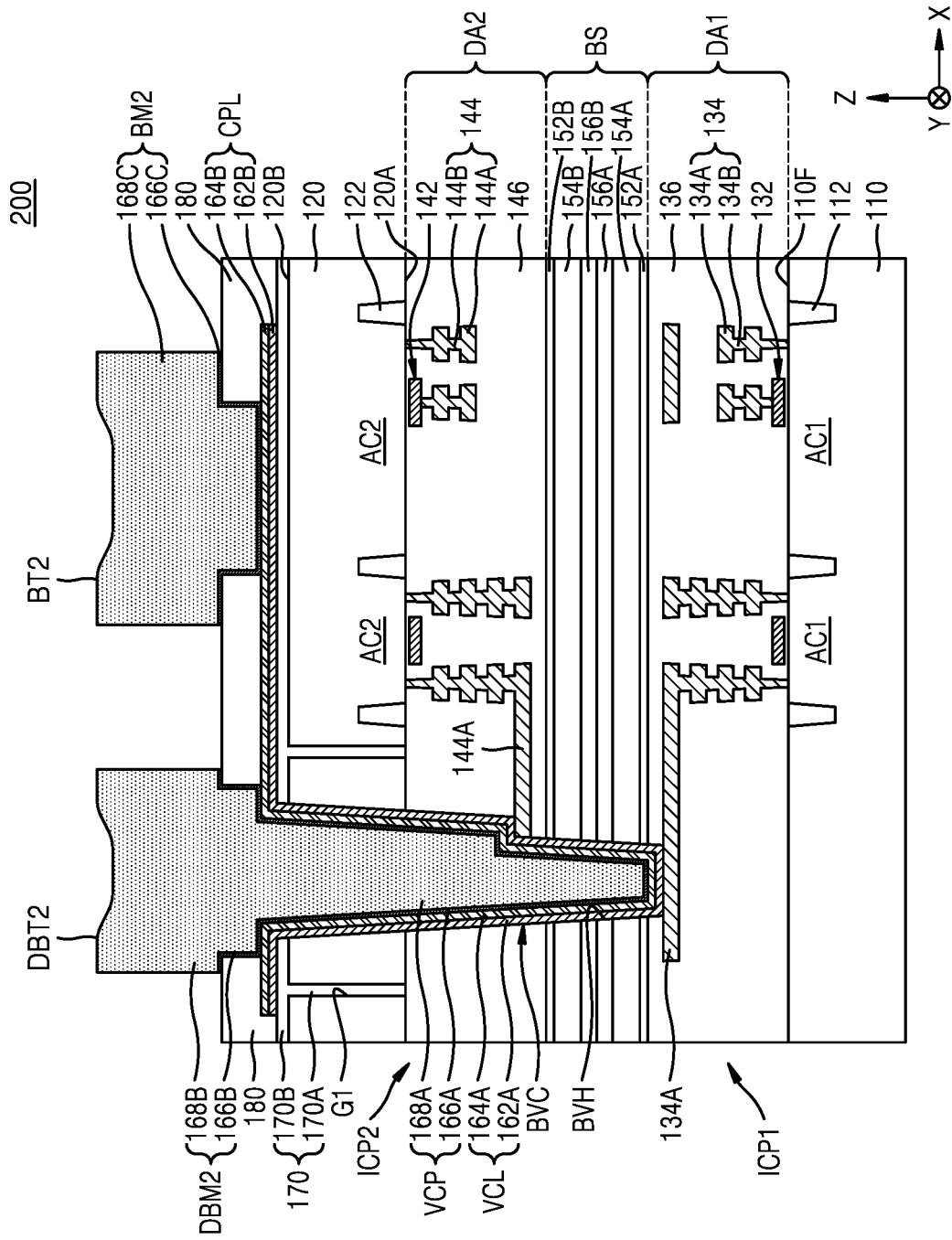
FIG. 2 is a cross-sectional view of a partial region of an IC chip according to example embodiments.

FIG. 2 is a cross-sectional view of a partial region of an IC chip 200 according to example embodiments.

Referring to FIG. 2, the IC chip 200 may have substantially the same configuration as the IC chip 100 shown in FIGS. 1A and 1B except, for example, the IC chip 200 may include a dummy bump structure DBM2 and a bump structure BM2 having top surfaces DBT2 and BT2, which are at the same level. In some examples, the IC chip 200 may include the dummy bump structure DBM2 and the bump structure BM2 having the same vertical level of top surfaces DBT2 and BT2 by using a chemical mechanical planarization (CMP) process. In this case, the top surfaces DBT2 and BT2 may be flat. Detailed other configurations of the dummy bump structure DBM2 and the bump structure BM2 may be substantially the same as those of the dummy bump structure DBM and the bump structure BM described with reference to FIGS. 1A and 1B.

Figure 3:
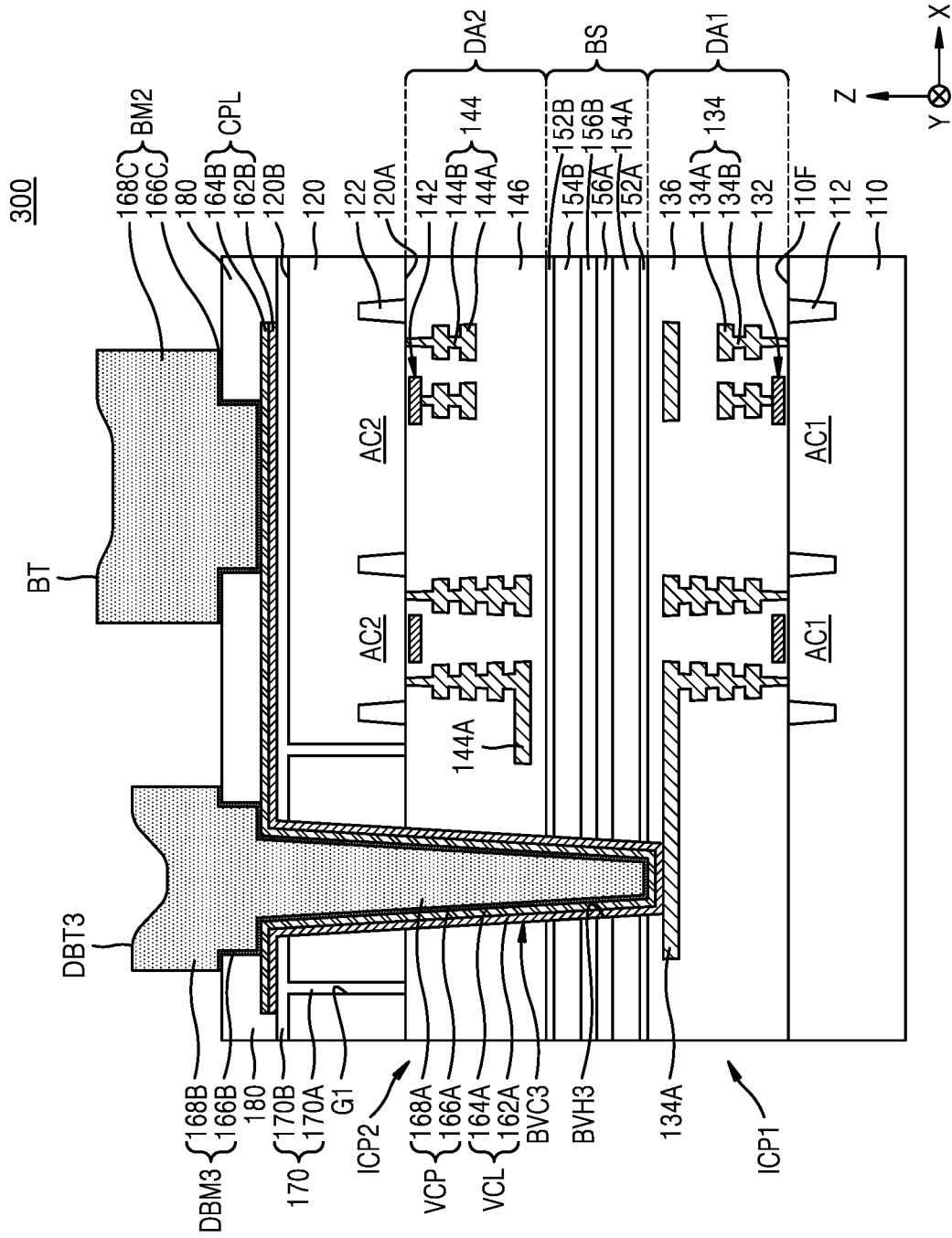
FIG. 3 is a cross-sectional view of a partial region of an IC chip according to example embodiments.

FIG. 3 is a cross-sectional view of a partial region of an IC chip 300 according to example embodiments.

Referring to FIG. 3, the IC chip 300 may have substantially the same configuration as the IC chip 100 shown in FIGS. 1A and 1B except, for example, the IC chip 300 may include a through-via contact portion BVC3, which extends in a vertical direction (Z direction) along a through hole BVH3 formed to pass through a first IC portion ICP1 and a bonding structure BS, and a dummy bump structure DBM3, which is integrally connected to the through-via contact portion BVC3 and protrudes from one end of the through-via contact portion BVC3 to the outside of the through hole BVH3. The through-via contact portion BVC3 may not be connected to an interconnection layer 144A of a second device layer DA2 but connected to only an interconnection layer 134A of a first device layer DA1. The dummy bump structure DBM3 may have a top surface DBT3, which has a concave shape, and at least a portion of the dummy bump structure DBM3 may have a portion having a thickness smaller than that of the bump structure BM in a vertical direction (Z direction). Detailed configurations of the through-via contact portion BVC3 and the dummy bump structure DBM3 may be substantially the same as those of the through-via contact portion BVC and the dummy bump structure DBM described with reference to FIGS. 1A and 1B.

Figure 4:
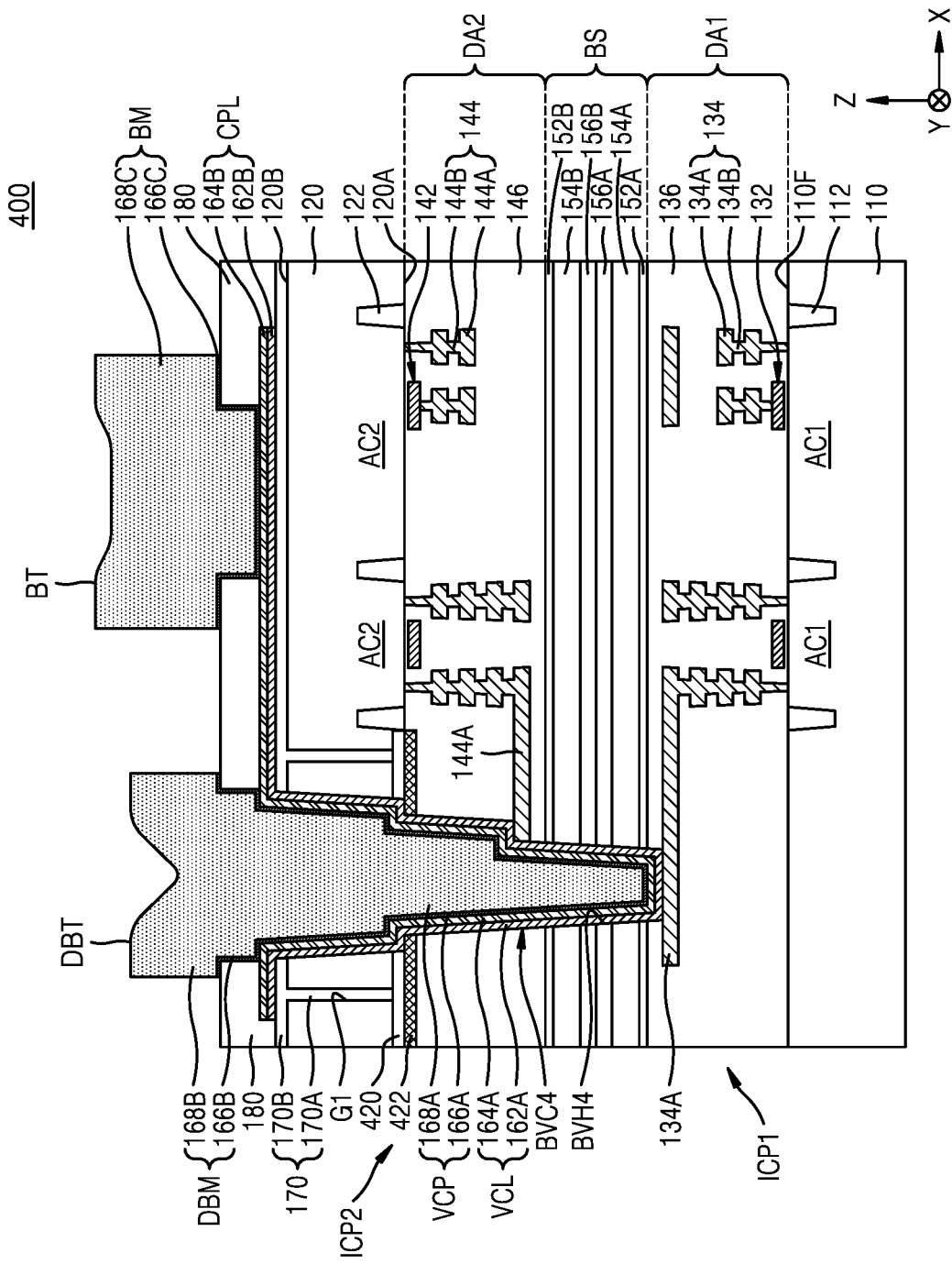
FIG. 4 is a cross-sectional view of a partial region of an IC chip according to example embodiments.

FIG. 4 is a cross-sectional view of a partial region of an IC chip 400 according to example embodiments.

Referring to FIG. 4, the IC chip 400 may have substantially the same configuration as the IC chip 100 shown in FIGS. 1A and 1B except, for example, the IC chip 400 may include an etch retardation film 420 and a contact plug pad 422, which are formed adjacent to an active surface 120A of a second substrate 120 included in a second IC portion ICP2, and a through-via contact portion BVC4, which is in contact with the contact plug pad 422. The etch retardation film 420 and the contact plug pad 422 may be in contact with each other. The through-via contact portion BVC4 may include a portion, which is in contact with the contact plug pad 422 through the etch retardation film 420 and self-aligned by the contact plug pad 422.

The etch retardation film 420 may include an insulating material. For example, the etch retardation film 420 may include a silicon oxide film, a silicon nitride film, or a combination thereof. The contact plug pad 422 may include a conductive material. In some embodiments, the contact plug pad 422 may include a metal, a metal silicide, a conductive metal nitride, or a combination thereof. The contact plug pad 422 may include a metal selected out of W, Al, Cu, and Ti or doped polysilicon. In some embodiments, the contact plug pad 422 may include the same material as at least portions of a plurality of multi-layered interconnection structures (e.g., 134 and 144).

The etch retardation film 420 may be buried in the second substrate 120. The etch retardation film 420 may be formed before an interlayer insulating film 146 is formed on the second substrate 120. The contact plug pad 422 may be formed on the etch retardation film 420 in alignment with the etch retardation film 420 after the etch retardation film 420 buried in the second substrate 120 is formed and before the interlayer insulating film 146 is formed.

The closer the through-via contact portion BVC4 formed in a through hole BVH4 gets to a dummy bump structure DBM, the greater a width of the through-via contact portion BVC4 in a lateral direction may become. The width of the through-via contact portion BVC4 may discontinuously vary in a direction in which the through-via contact portion BVC4 extends from the dummy bump structure DBM toward the first substrate 110. For instance, a lateral width of the through-via contact portion BVC4 may be relatively sharply reduced at a position in which the through-via contact portion BVC4 passes through the contact plug pad 422. A lateral width of the through-via contact portion BVC4 may be relatively sharply reduced at a position in which the through-via contact portion BVC4 passes through an interconnection layer 144A that contacts the through-via contact portion BVC4. The through-via contact portion BVC4 may have a greater lateral width toward the dummy bump structure DBM. Thus, good gap-fill characteristics may be obtained when a first connection metal layer 168A is formed to fill the inside of a through hole BVH4.

In some embodiments, any one of the etch retardation film 420 and the contact plug pad 422 may be omitted. In this case, the through-via contact portion BVC4 may be formed to be self-aligned by any one of the etch retardation film 420 and the contact plug pad 422. The lateral width of the through-via contact portion BVC4 may be relatively sharply reduced at a position in which the through-via contact portion BVC4 passes through any one of the etch retardation film 420 and the contact plug pad 422 in a direction from the dummy bump structure DBM toward the first substrate 110. A detailed configuration of the through-via contact portion BVC4 may be substantially the same as that of the through-via contact portion BVC described with reference to FIGS. 1A and 1B.

Figure 5:
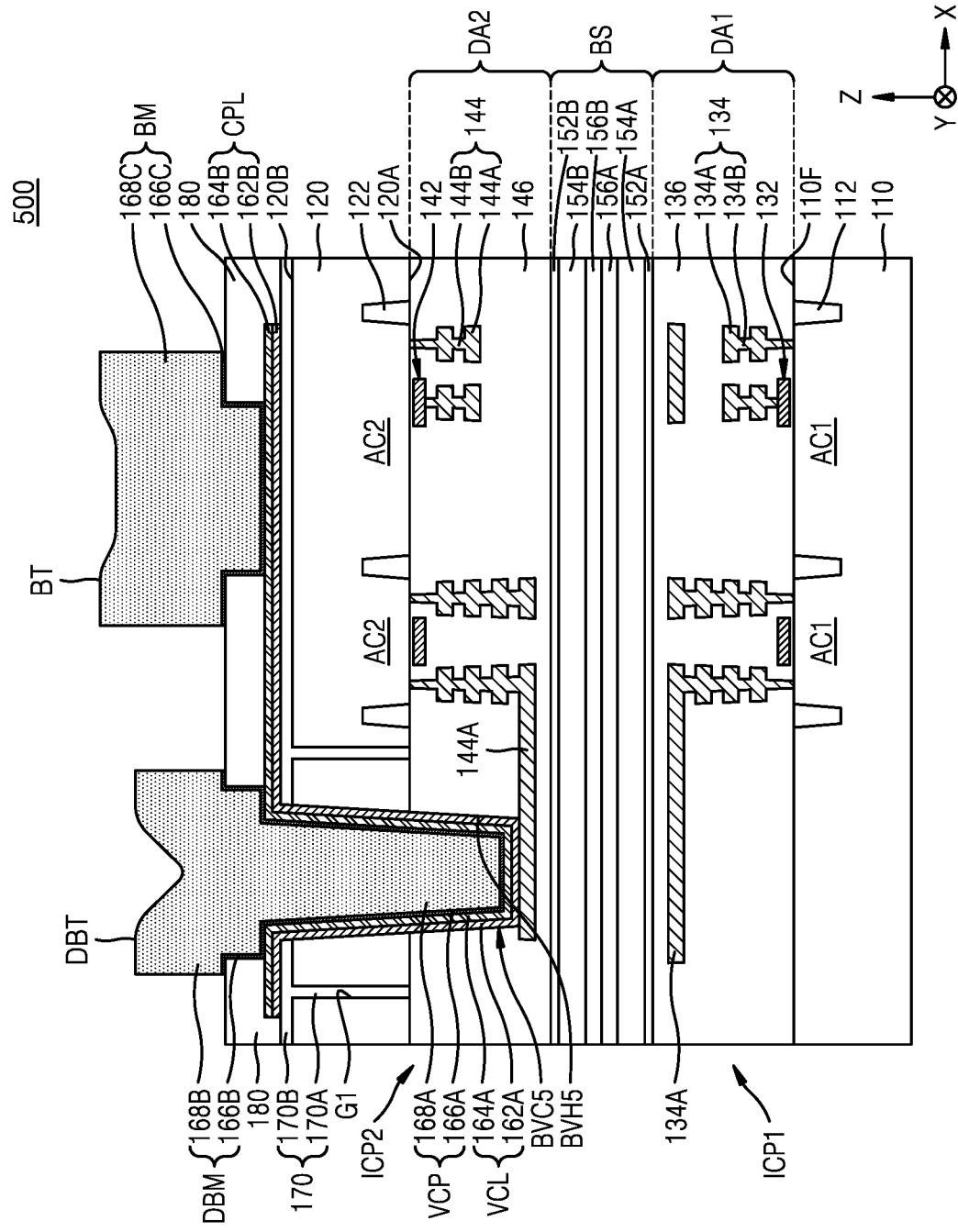
FIG. 5 is a cross-sectional view of a partial region of an IC chip according to example embodiments.

FIG. 5 is a cross-sectional view of a partial region of an IC chip 500 according to example embodiments.

Referring to FIG. 5, the IC chip 500 may have substantially the same configuration as the IC chip 100 shown in FIGS. 1A and 1B except, for example, the IC chip 500 may include a through-via contact portion BVC5, which extends in a vertical direction (Z direction) along a through hole BVH5 formed to pass through a portion of a second IC portion ICP2. The through-via contact portion BVC5 may not be connected to an interconnection layer 134A of a first device layer DA1 but connected to an interconnection layer 144A of a second device layer DA2. The through-via contact portion BVC5 may be located at a position spaced apart from a first IC portion ICP1 and a bonding structure BS in the vertical direction. The dummy bump structure DBM may be integrally connected to the through-via contact portion BVC5 and protrudes from one end of the through-via contact portion BVC5 to the outside of the through the through hole BVH5. A detailed configuration of the through-via contact portion BVC5 may be substantially the same as that of the through-via contact portion BVC described with reference to FIGS. 1A and 1B.

Figure 6:
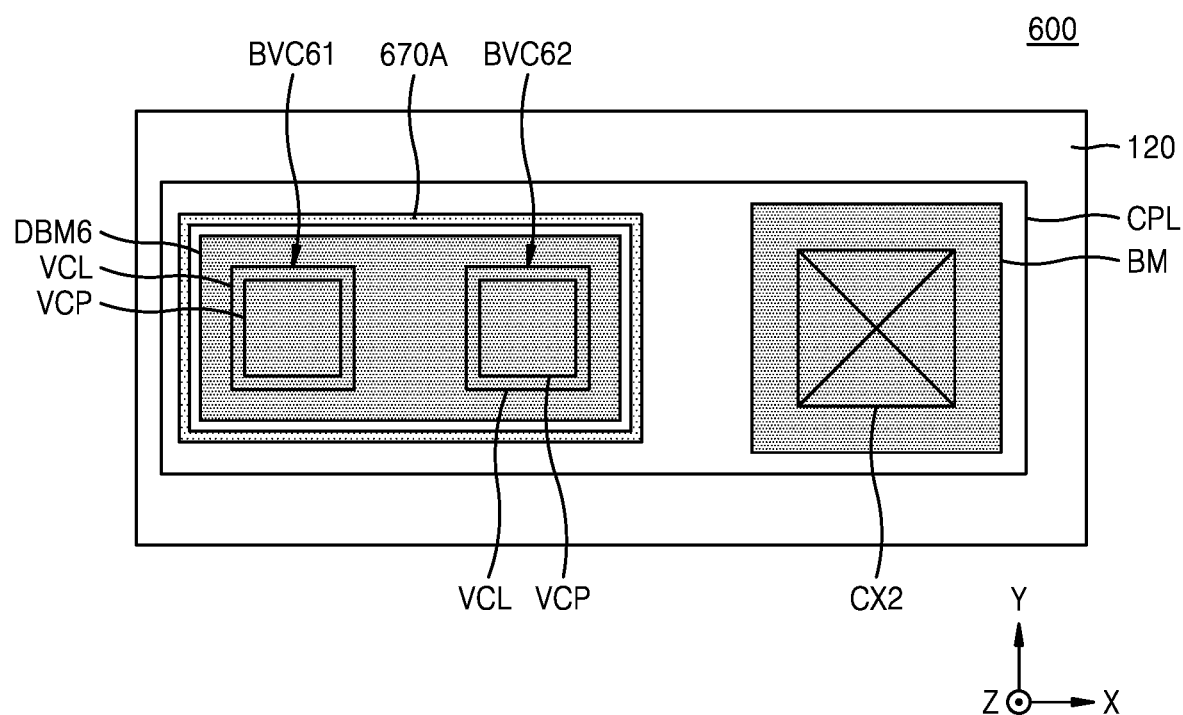
FIG. 6 is a plan view of a partial region of an IC chip according to example embodiments.

FIG. 6 is a plan view of a partial region of an IC chip 600 according to example embodiments.

Referring to FIG. 6, the IC chip 600 may have substantially the same configuration as the IC chip 100 shown in FIGS. 1A and 1B except, for example, the IC chip 600 may include two through-via contact portions (e.g., BVC61 and BVC62), which are located adjacent to each other, and the two through-via contact portions BVC61 and BVC62 may be connected to one dummy bump structure DBM6. The two through-via contact portions BVC61 and BVC62 may be surrounded by one through insulating portion 670A having a ring shape. A detailed configuration of each of the through-via contact portions BVC61 and BVC62 may be substantially the same as that of the through-via contact portion BVC described with reference to FIGS. 1A and 1B. Detailed configurations of the dummy bump structure DBM6 and the through insulating portion 670A may be respectively substantially the same as those of the dummy bump structure DBM and the through insulating portion 170A described with reference to FIGS. 1A and 1B.

FIG. 6 illustrates an example in which each of the through-via contact portions BVC61 and BVC62, the dummy bump structure DBM6, and the through insulating portion 670A has a rectangular planar shape, but the inventive concept is not limited thereto. Each of the through-via contact portions BVC61 and BVC62, the dummy bump structure DBM6, and the through insulating portion 670A may have one of various planar shapes, such as a circular shape, an elliptical shape, and a polygonal shape. Although FIG. 6 illustrates an example in which two through-via contact portions BVC61 and BVC62 are connected to one dummy bump structure DBM6, the two through-via contact portions BVC61 and BVC62 may be respectively connected to additional dummy bump structures (not shown), which are separated from each other.

Figure 7:
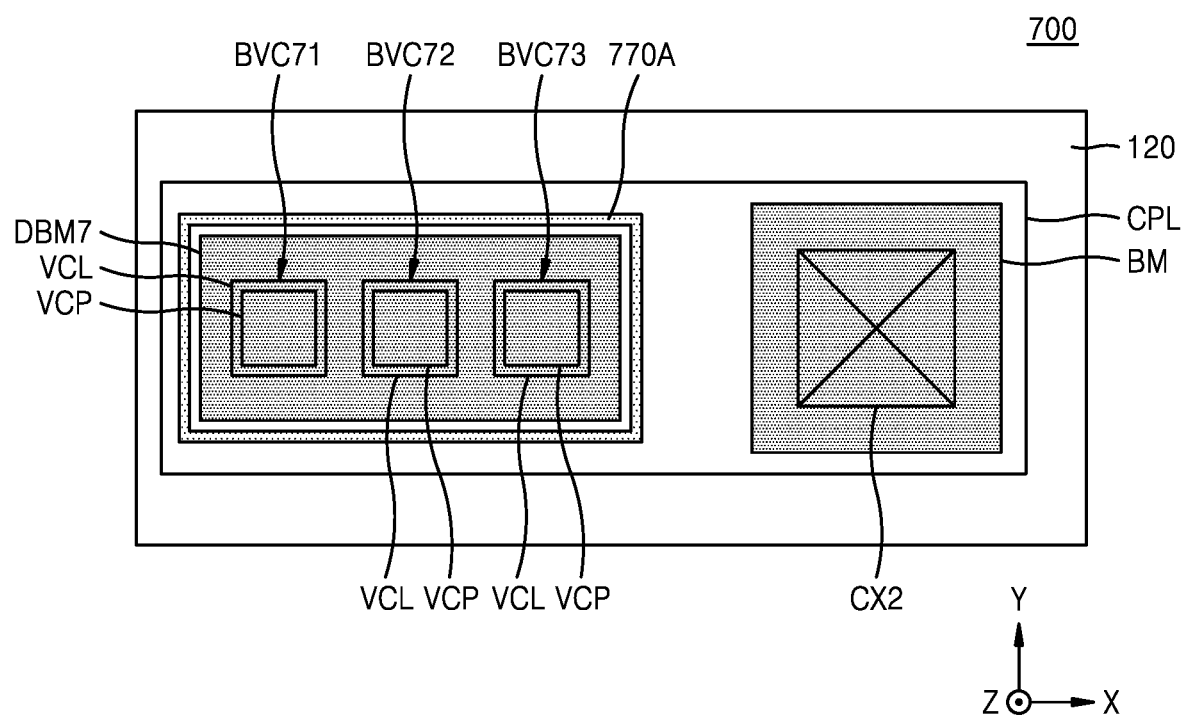
FIG. 7 is a plan view of a partial region of an IC chip according to example embodiments.

FIG. 7 is a plan view of a partial region of an IC chip 700 according to example embodiments.

Referring to FIG. 7, the IC chip 700 may have substantially the same configuration as the IC chip 100 shown in FIGS. 1A and 1B except, for example, the IC chip 700 may include three through-via contact portions BVC71, BVC72, and BVC73, which are located adjacent to each other, and the three through-via contact portions BVC71, BVC72, and BVC73 may be connected to one dummy bump structure DBM7. The three through-via contact portions BVC71, BVC72, and BVC73 may be surrounded by one through insulating portion 770A having a ring shape. A detailed configuration of each of the through-via contact portions BVC71, BVC72, and BVC73 may be substantially the same as that of the through-via contact portion BVC described with reference to FIGS. 1A and 1B. Detailed configurations of the dummy bump structure DBM7 and the through insulating portion 770A may be respectively substantially the same as those of the dummy bump structure DBM and the through insulating portion 170A described with reference to FIGS. 1A and 1B.

Each of the through-via contact portions BVC71, BVC72, and BVC73, the dummy bump structure DBM7, and the through insulating portion 770A is not limited to a planar shape shown in FIG. 7 but may have various planar shapes. Although FIG. 7 illustrates an example in which the three through-via contact portions BVC71, BVC72, and BVC73 are connected to one dummy bump structure DBM7, some selected out of the three through-via contact portions BVC71, BVC72, and BVC73 may be connected to a dummy bump structure different from a dummy bump structure connected to some others selected out of the three through-via contact portions BVC71, BVC72, and BVC73. One or two through-via contact portions selected out of the three through-via contact portions BVC71, BVC72, and BVC73 may be one or two dummy through-via contact portions that are not electrically connected to another external conductor.

Figure 8:
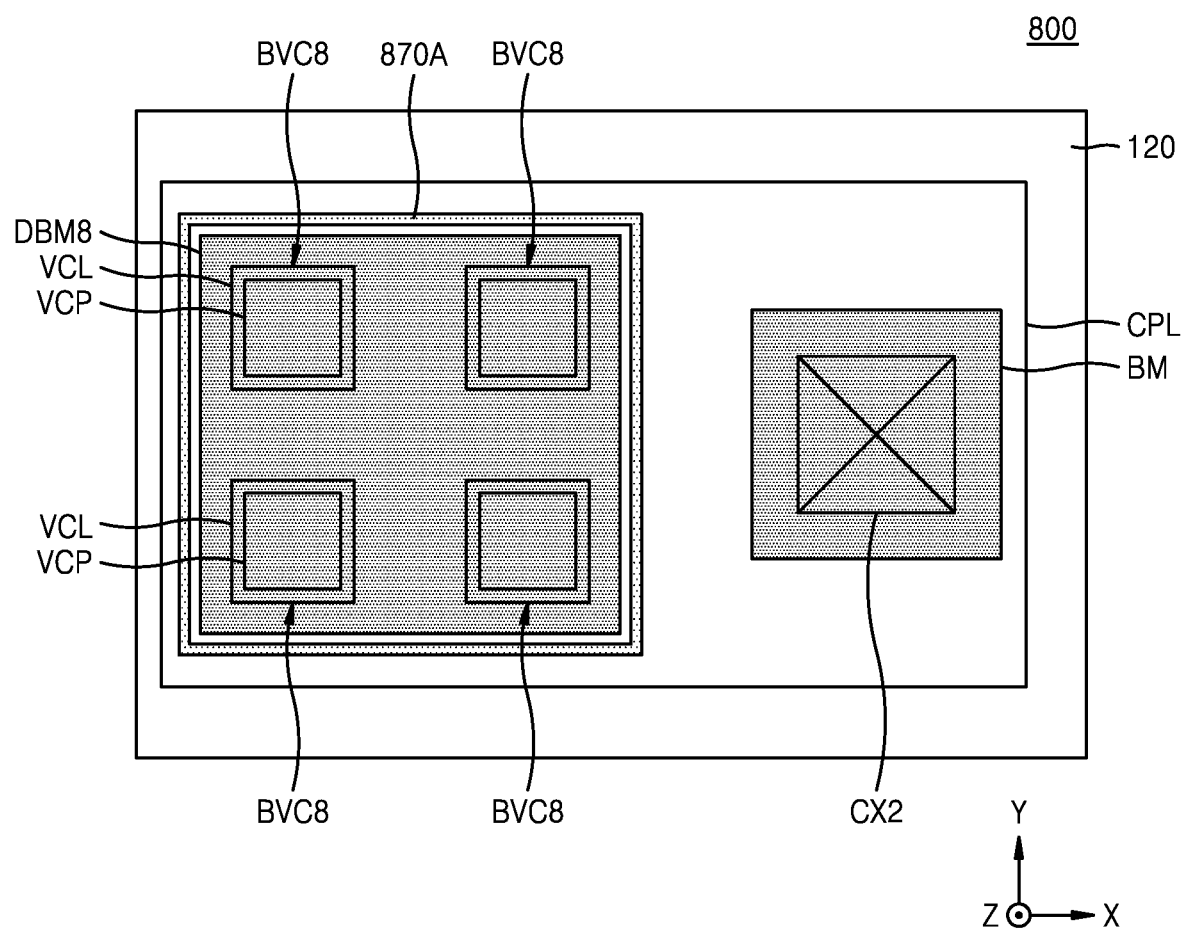
FIG. 8 is a plan view of a partial region of an IC chip according to example embodiments.

FIG. 8 is a plan view of a partial region of an IC chip 800 according to example embodiments.

Referring to FIG. 8, the IC chip 800 may have substantially the same configuration as the IC chip 100 shown in FIGS. 1A and 1B except, for example, the IC chip 800 may include a plurality of through-via contact portions BVC8, which are located adjacent to each other and arranged in a matrix form. The plurality of through-via contact portions BVC8 may be connected to one dummy bump structure DBM8. The plurality of through-via contact portions BVC8 may be surrounded by one through insulating portion 870A having a ring shape. A detailed configuration of each of the plurality of through-via contact portions BVC8 may be substantially the same as that of the through-via contact portion BVC described with reference to FIGS. 1A and 1B. Detailed configurations of the dummy bump structure DBM8 and the through insulating portion 870A may be substantially the same as those of the dummy bump structure DBM and the through insulating portion 170A described with reference to FIGS. 1A and 1B. Each of the plurality of through-via contact portions BVC8, the dummy bump structure DBM8, and the through insulating portion 870A is not limited to a planar shape shown in FIG. 8 but may have various planar shapes. Some through-via contact portions BVC8 selected out of the plurality of through-via contact portions BVC8 may be dummy through-via contact portions, which are not electrically connected to another external conductor.

Figure 9:
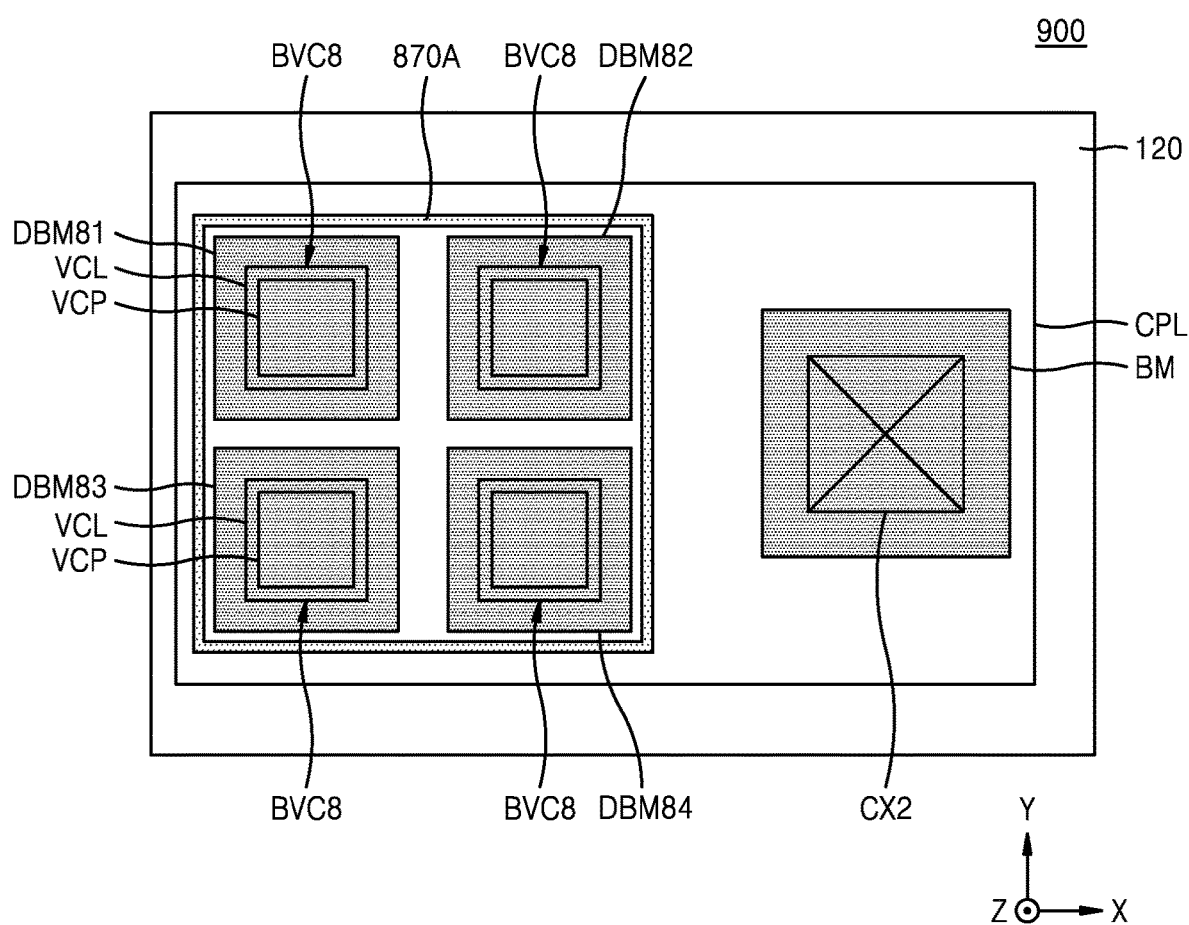
FIG. 9 is a plan view of a partial region of an IC chip according to example embodiments.

FIG. 9 is a plan view of a partial region of an IC chip 900 according to example embodiments.

Referring to FIG. 9, the IC chip 900 may have substantially the same configuration as the IC chip 800 shown in FIG. 8 except, for example, in the IC chip 900, a plurality of through-via contact portions BVC8 may be respectively connected to different dummy bump structures of a plurality of dummy bump structures (e.g., DBM81, DBM82, DBM83, and DBM84). The plurality of dummy bump structures DBM81, DBM82, DBM83, and DBM84 may be surrounded by one through insulating portion 870A having a ring shape. A detailed configuration of each of the plurality of dummy bump structures DBM81, DBM82, DBM83, and DBM84 may be the same as that of the dummy bump structure DBM described with reference to FIGS. 1A and 1B.

Figure 10:
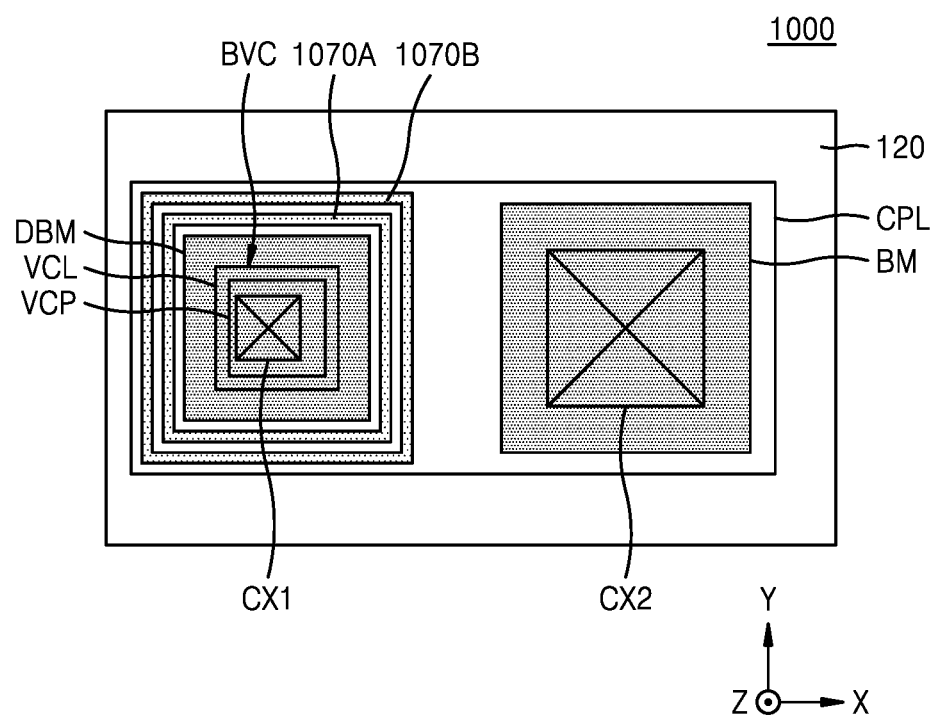
FIG. 10 is a plan view of a partial region of an IC chip according to example embodiments.

FIG. 10 is a plan view of a partial region of an IC chip 1000 according to example embodiments.

Referring to FIG. 10, the IC chip 1000 may have substantially the same configuration as the IC chip 100 shown in FIGS. 1A and 1B except, for example, in the IC chip 1000, a through-via contact portion BVC may be surrounded by a plurality of through insulating portions (e.g., 1070A and 1070B), which are located apart from each other. In some embodiments, the plurality of through insulating portions 1070A and 1070B may be configured to be connected to each other. A detailed configuration of each of the plurality of through insulating portions 1070A and 1070B may be the same as that of the through insulating portion 170A described with reference to FIGS. 1A and 1B.

Figure 11:
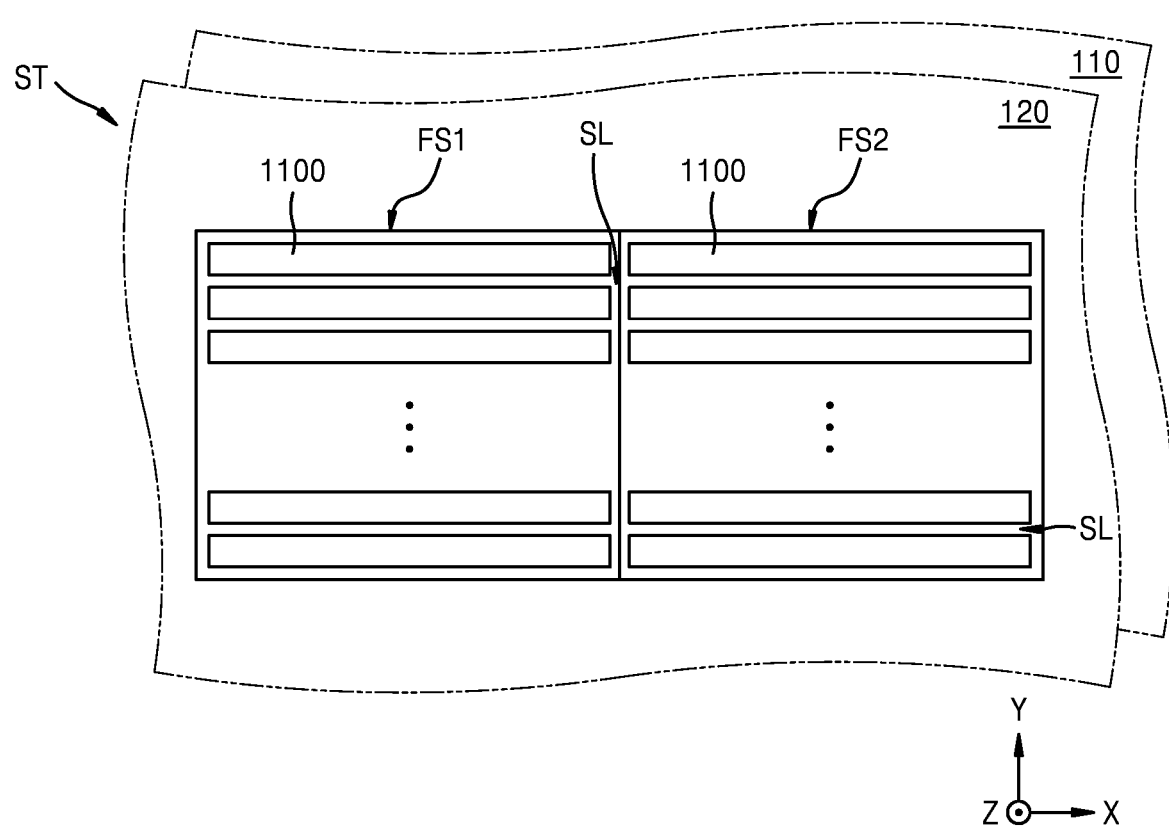
FIG. 11 is a schematic plan view of a stack structure including a plurality of IC chips according to example embodiments.

FIG. 11 is a plan view of a stack structure ST including a plurality of IC chips 1100 according to example embodiments.

Referring to FIG. 11, the stack structure ST may have a structure in which a first substrate 110 and a second substrate 120 are stacked in a vertical direction (Z direction). A plurality of first device layers DA1 may be formed on the first substrate 110, and a plurality of second device layers DA2 may be formed on the second substrate 120. The stack structure ST may include a plurality of IC chips 1100. FIG. 11 illustrates a plurality of IC chips 1100 included in two full-shots FS1 and FS2, from among the plurality of IC chips 1100 included in the stack structure ST. The plurality of IC chips 1100 shown in FIG. 11 may be still in a state before the plurality of IC chips 1100 are separated from each other and singulated through a sawing process. Each of the plurality of IC chips 1100 may have a structure of any one of the IC chips 100, 200, 300, 400, 500, 600, 700, 800, 900, and 1000 described with reference to FIGS. 1A, 1B, and 2 to 10.

In the stack structure ST, the plurality of IC chips 1100 may be located apart from each other with a scribe lane SL therebetween. The full-shots FS1 and FS2 may include a plurality of IC chips 1100. Each of the plurality of IC chips 1100 may constitute a DDI chip.

Figure 12:
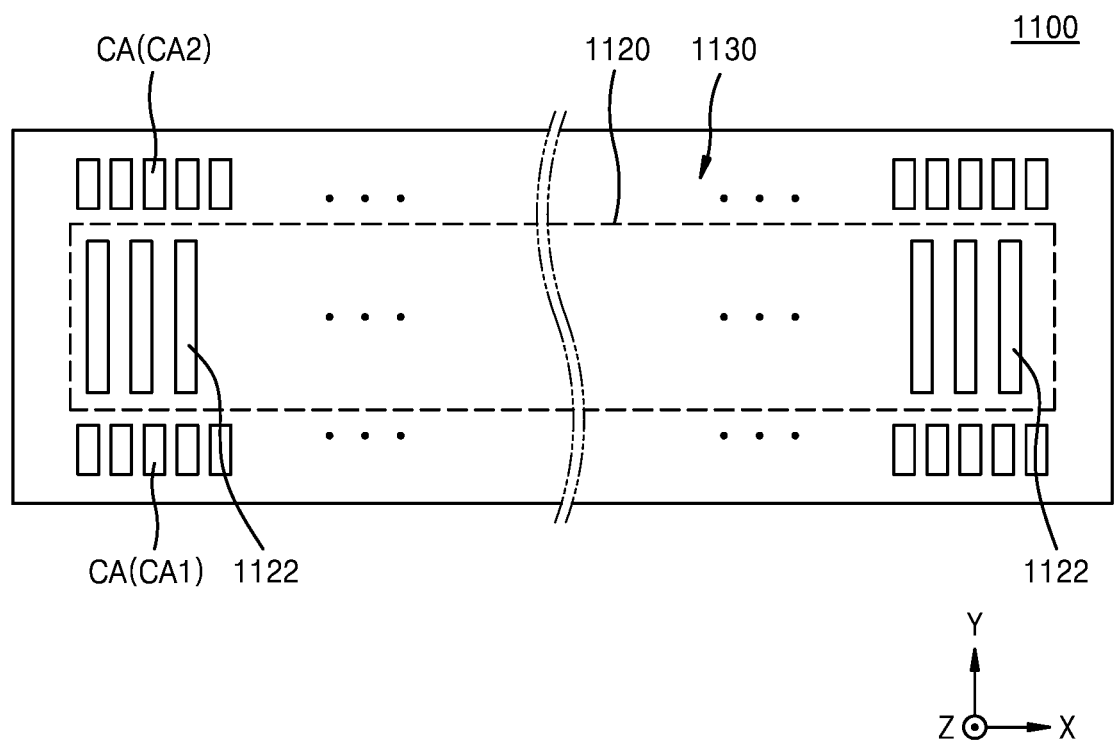
FIG. 12 is a plan view of a configuration of any one of the plurality of IC chips shown in FIG. 11, according to an example embodiment.

FIG. 12 is a plan view of a configuration of any one of the plurality of IC chips 1100 shown in FIG. 11, according to an example embodiment.

Referring to FIG. 12, the IC chip 1100 may include a circuit region 1120 and a peripheral region 1130 located around the circuit region 1120. Although a boundary between the circuit region 1120 and the peripheral region 1130 is illustrated with a dashed line in FIG. 12 for brevity, the boundary between the circuit region 1120 and the peripheral region 1130 may not be physically distinguished. A plurality of driving circuit cells 1122 and a plurality of interconnection patterns (not shown) may be located in the circuit region 1120. A plurality of connection portions CA may be formed in the peripheral region 1130. Each of the plurality of connection portions CA of the IC chip 1100 may include any one selected out of the bump structures BM and BM2 described with reference to FIGS. 1A, 1B, and 2 to 10.

The plurality of connection portions CA may include a plurality of input electrode pads CA1 and a plurality of output electrode pads CA2.

Each of the plurality of driving circuit cells 1122 may be electrically connected to any one of the plurality of connection portions CA through the plurality of interconnection patterns. The plurality of driving circuit cells 1122 may generate data signals for driving a display panel (e.g., a display panel 2300 shown in FIG. 14) in response to driving control signals and a power signal, which are applied by an external device (e.g., an external printed circuit board (PCB)) through the input electrode pad CA1 and output the data signals to the output electrode pad CA2. The plurality of driving circuit cells 1122 may include a shift register, a data register, a line latch unit, a digital-to-analog converter (DAC), and an output buffer unit, but are not limited thereto. In some embodiments, similar to the IC chips 100, 200, 300, 400, and 500 shown in FIGS. 1A, 1B, and 2 to 5, the plurality of driving circuit cells 1122 may include a first device layer DA1 formed on a first substrate 110 and a second device layer DA2 formed on a second substrate 120. The first device layer DA1 may include devices configured to operate in a low-power mode as compared with devices included in the second device layer DA2.

The plurality of input electrode pads CA1 may constitute an input portion of the IC chip 1100 along with input connection terminals, and the plurality of output electrode pads CA2 may constitute an output portion of the IC chip 1100 along with output connection terminals. In some embodiments, each of the input connection terminals and the output connection terminals may include any one of the bump structures BM described with reference to FIGS. 1A, 1B, and 2 to 10.

Figure 13A:
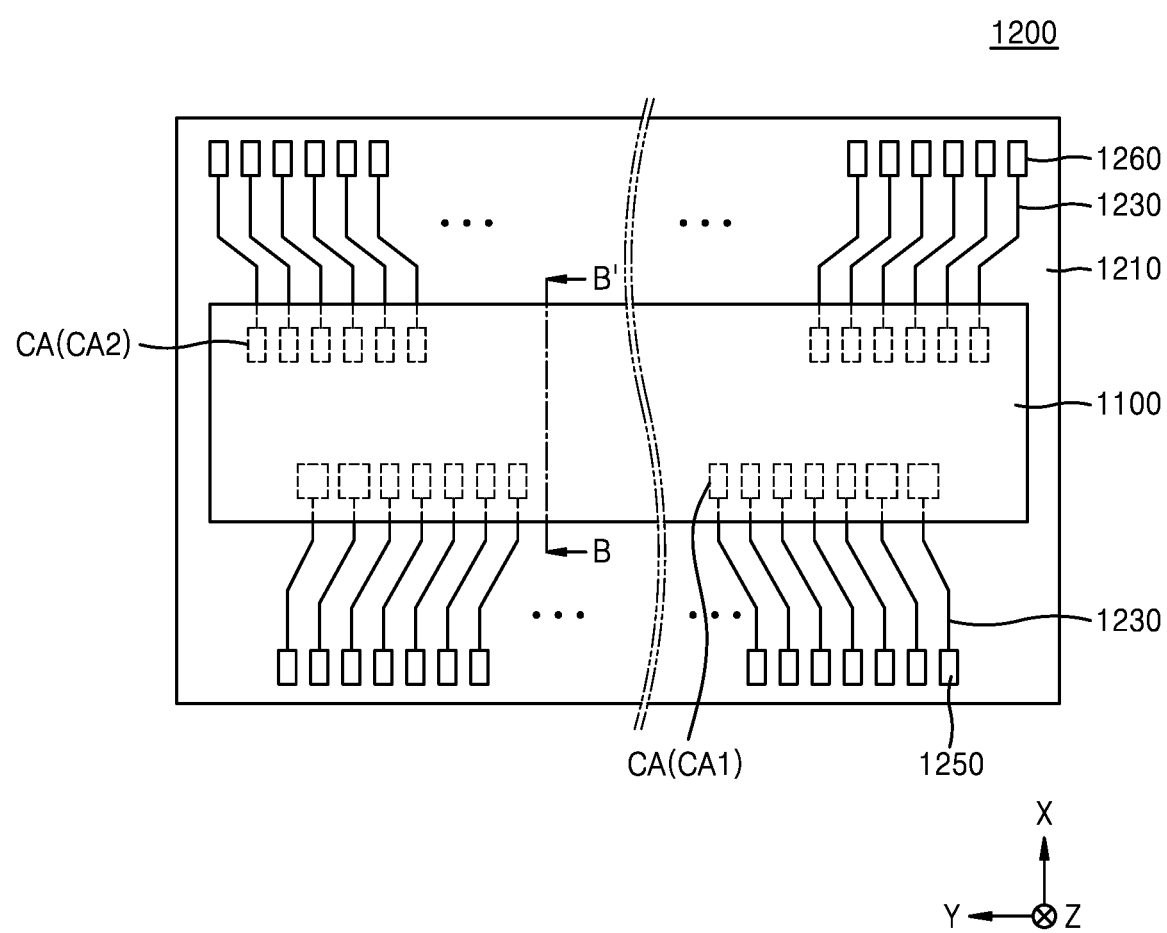
FIG. 13A is a schematic plan view of an IC package according to example embodiments.
Figure 13B:
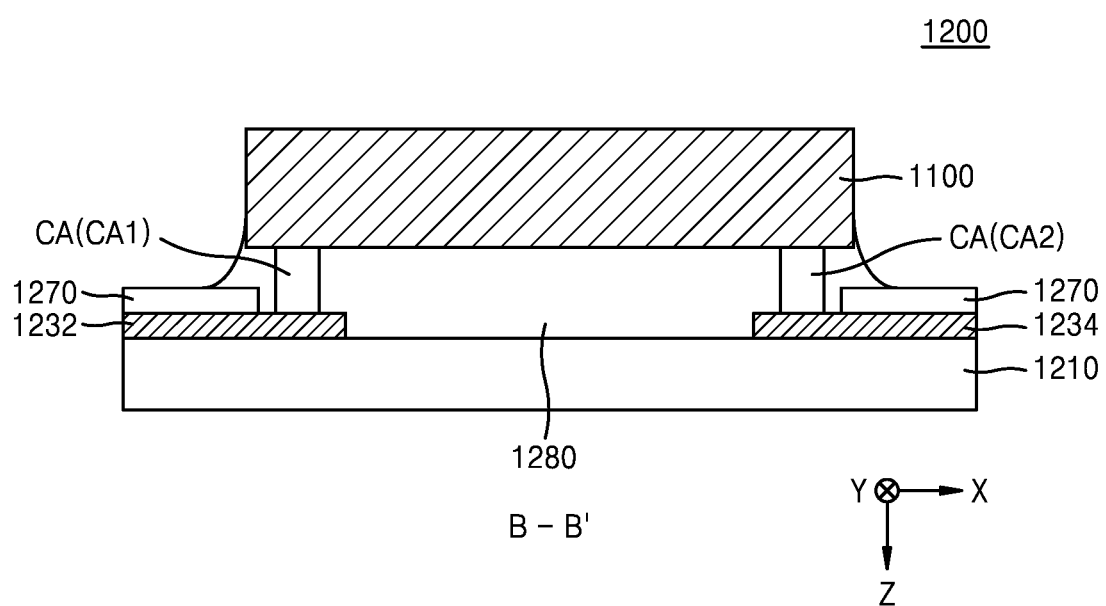
FIG. 13B is an enlarged cross-sectional view taken along a line B-B' of FIG. 13A.

FIG. 13A is a schematic plan view of an IC package 1200 according to example embodiments, and FIG. 13B is an enlarged cross-sectional view taken along a line B-B' of FIG. 13A. Although FIG. 13A does not show connection portions CA along the line B-B', two connection portions CA may be disposed along the line B-B' as shown in FIG. 13B.

Referring to FIGS. 13A and 13B, the IC package 1200 may include the IC chip 1100 described with reference to FIG. 12 and a support substrate 1210 having a mounting surface on which the IC chip 1100 is mounted. The IC chip 1100 included in the IC package 1200 may be in a state after the plurality of IC chips 1100 shown in FIG. 11 are separated into individual chips through a sawing process.

Figure 14:
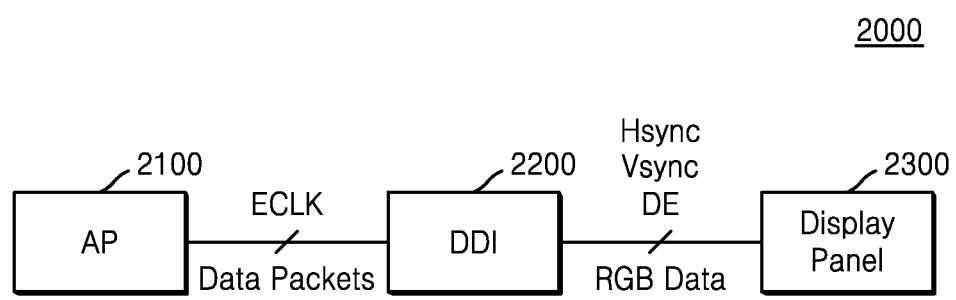
FIG. 14 is a block diagram of a display apparatus according to example embodiments.

In some embodiments, the IC chip 1100 may be a source driving chip (or, a source driver) configured to receive a signal voltage from an external device (e.g., an external printed circuit board (PCB)), generate an image signal, and output the image signal to a data line (or, a source line) of a display panel (e.g., the display panel 2300 shown in FIG. 14). In some other embodiments, the IC chip 1100 may be a gate driving chip (or, a gate driver) configured to generate a scanning signal including an on/off signal of a transistor and output the scanning signal to a gate line of the display panel.

In some embodiments, the support substrate 1210 may include a flexible film. For example, the support substrate 1210 may include polyimide, but is not limited thereto. The IC chip 1100 may be mounted on the mounting surface of the support substrate 1210 using a flip-chip bonding method through bump structures included in a plurality of connection portions CA. The bump structure included in the connection portion CA may be any one selected out of the bump structures BM and BM2 described with reference to FIGS. 1A, 1B, and 2 to 10.

A plurality of conductive lines 1230 may be formed on the support substrate 1210. The plurality of conductive lines 1230 may include a metal, for example, copper (Cu). The plurality of conductive lines 1230 may include an input interconnection portion 1232 and an output interconnection portion 1234. A plurality of input electrode pads CA1 may be connected to an input interconnection electrode 1250 located on the support substrate 1210 through an input interconnection portion 1232. A plurality of output electrode pads CA2 may be connected to an output interconnection electrode 1260 located on the support substrate 1210 through an output interconnection portion 1234.

The IC chip 1100 may include a structure of any one of the IC chips 100, 200, 300, 400, 500, 600, 700, 800, 900, and 1000 described with reference to FIGS. 1A, 1B, and 2 to 10. Each of the bump structures BM and BM2 may be directly connected to any one of the plurality of conductive lines 1230. Each of the dummy bump structures DBM, DBM2, DBM3, DBM6, DBM7, DBMS, DBM81, DBM82, DBM83, and DBM84 may not be directly connected to any one of the plurality of conductive lines 1230.

A solder resist layer 1270 may be formed on the support substrate 1210. The solder resist layer 1270 may cover portions of the plurality of conductive lines 1230. Portions of the input interconnection portion 1232 and the output interconnection portion 1234, which are connected to the connection portion CA, may not be covered by the solder resist layer 1270. The solder resist layer 1270 may include insulating ink, photosensitive solder resist, or a solder resist film.

A space between the IC chip 1100 and the support substrate 1210 may be filled with an underfill layer 1280. The underfill layer 1280 may include an epoxy resin.

Portions of the plurality of connection portions CA and the plurality of the conductive lines 1230, which may overlap the IC chip 1100 in a vertical direction (Z direction) may be located under the IC chip 1100. Accordingly, the portions of the plurality of connection portions CA and the plurality of conductive lines 1230, which are covered by the IC chip 1100, may not be visible from above in the plan view of FIG. 13A.

The IC chip 1100 included in the IC package 1200 described with reference to FIGS. 13A and 13B may be similar to the IC chips 100, 200, 300, 400, 500, 600, 700, 800, 900, and 1000 described with reference to FIGS. 1A, 1B, and 2 to 10 in that a first connection metal layer 168A included in through-via contact portions BVC, BVC3, BVC4, and BVC5 and a third connection metal layer 168C included in a bump structure BM include the same metal. In addition, inner spaces of the through-via contact portions BVC, BVC3, BVC4, and BVC5, which are surrounded by a via contact liner VCL, may be filled with not an insulating material but a metal so that the entire horizontal sectional areas of the through-via contact portions BVC, BVC3, BVC4, and BVC5 may be used as conductive regions. Thus, resistances of the through-via contact portions BVC, BVC3, BVC4, and BVC5 may be markedly reduced, and a tolerance of the IC chip 1100 to physical stress may increase to improve the physical strength of the IC chip 1100. For example, when each of the first connection metal layer 168A and the third connection metal layer 168C includes Au having a relatively low resistivity, the resistances of the through-via contact portions BVC, BVC3, BVC4, and BVC5 may be further reduced. Accordingly, the reliability of the IC package 1200 including the IC chip 1100 may be improved.

FIG. 14 is a block diagram of a display apparatus 2000 according to example embodiments.

Referring to FIG. 14, the display apparatus 2000 may include an application processor (AP) 2100, a DDI chip 2200, and a display panel 2300.

The AP 2100 may control the overall operation of the display apparatus 2000 and receive and output data packets having display data in response to a clock signal ECLK. The data packets may include display data RGB Data, a horizontal synchronous signal Hsync, a vertical synchronous signal Vsync, and a data enable signal DE.

The DDI chip 2200 may receive the data packets from the AP 2100 and output the horizontal synchronous signal Hsync, the vertical synchronous signal Vsync, the data enable signal DE, and the display data RGB Data. In some embodiments, the AP 2100 and the DDI chip 2200 may perform interface functions, such as a mobile industry processor interface (MIPI), a mobile display digital interface (MDDI), and a compact display port (CDP). In some embodiments, a graphics memory (e.g., graphics RAM (GRAM)) may be embedded in the DDI chip 2200 to enable a high-speed serial interface (HSSI) with the AP 2100. In some other embodiments, to enable the HS SI with the AP 2100, the DDI chip 2200 may buffer data packets and output display data instead of using GRAM. The DDI chip 2200 may include at least one of the structures of the IC chips 100, 200, 300, 400, 500, 600, 700, 800, 900, and 1000 described with reference to FIGS. 1A, 1B, and 2 to 10. In some examples, the DDI chip 2200 may be the IC package 1200 described with reference to FIG. 13B.

The display panel 2300 may display the display data in units of frames via the control of the DDI chip 2200. The display panel 2300 may include an organic light emitting display (OLED) panel, a liquid crystal display (LCD) panel, a plasma display panel (PDP), an electrophoretic display panel, or an electrowetting display panel. In some embodiments, the display panel 2300 may be connected to a touch screen (not shown) and configured to receive sensing data from the touch screen.

In the display apparatus 2000 according to the inventive concept, the DDI chip 2200 may be similar to the IC chips 100, 200, 300, 400, 500, 600, 700, 800, 900, and 1000 described with reference to FIGS. 1A, 1B, and 2 to 10 in that a first connection metal layer 168A included in through-via contact portions BVC, BVC3, BVC4, and BVC5 and a third connection metal layer 168C included in a bump structure BM include the same metal. Also, inner spaces of the through-via contact portions BVC, BVC3, BVC4, and BVC5 may be filled with not an insulating material but a metal. Thus, resistances of the through-via contact portions BVC, BVC3, BVC4, and BVC5 may be markedly reduced, and a tolerance of the IC chip 1100 to stress may increase to improve the physical strength of the DDI chip 2200. For example, when each of the first connection metal layer 168A and the third connection metal layer 168C includes Au having a relatively low resistivity, the resistances of the through-via contact portions BVC, BVC3, BVC4, and BVC5 may be further reduced. Accordingly, the reliability of the display apparatus 2000 including the DDI chip 2200 may be improved.

FIGS. 15A to 15J are cross-sectional views of a process sequence of a method of manufacturing an IC chip 100, according to example embodiments. A method of manufacturing the IC chip 100 shown in FIGS. 1A and 1B, according to an example embodiment, will be described with reference to FIGS. 15A to 15J. In FIGS. 15A to 15J, the same reference numerals are used to denote the same elements as in FIGS. 1A and 1B, and repeated descriptions thereof will be omitted.

Figure 15A:
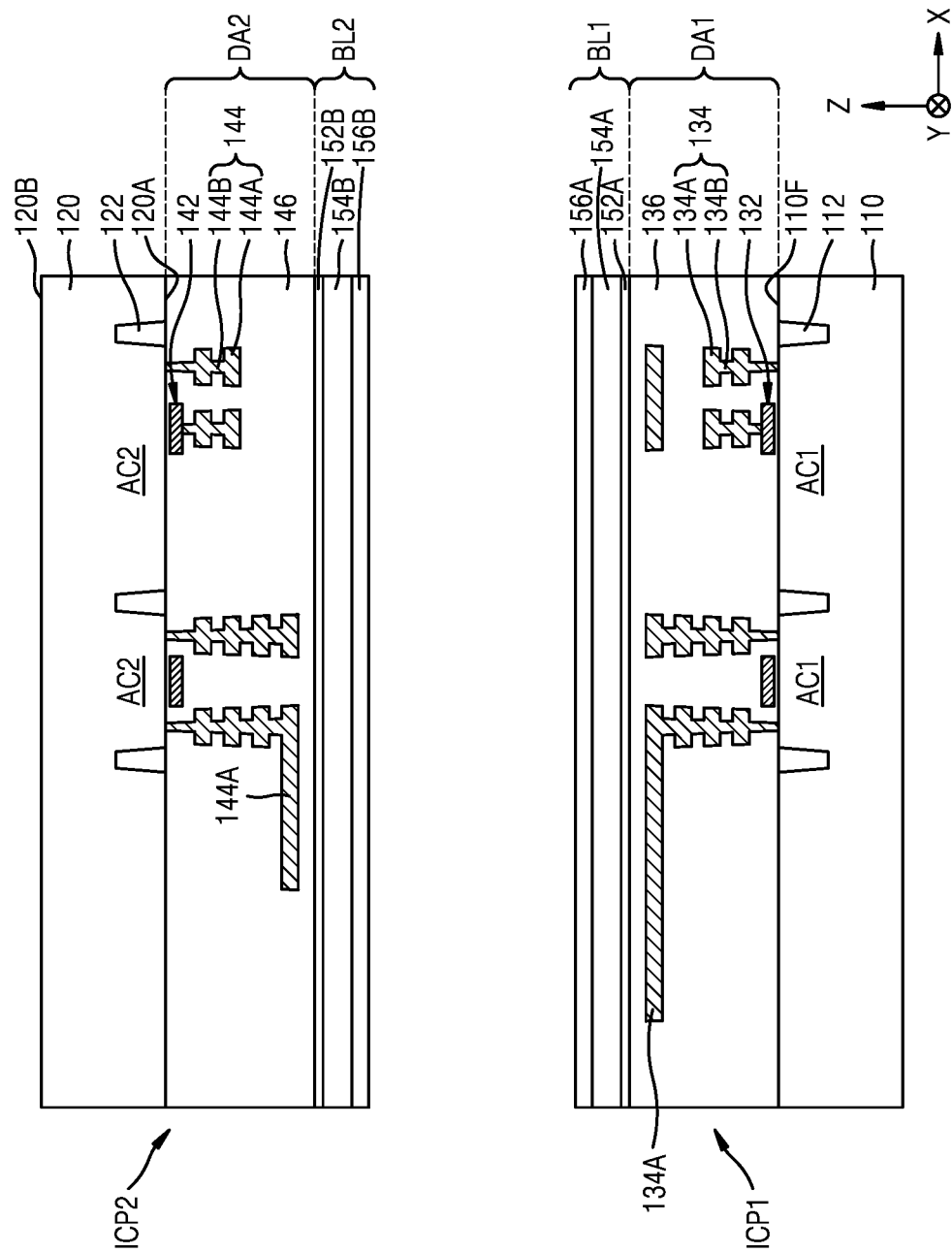
FIGS. 15A to 15J are cross-sectional views of a process sequence of a method of manufacturing an IC chip, according to example embodiments.

Referring to FIG. 15A, a first device layer DA1 may be formed on an active surface 110F of a first substrate 110 to form a first IC portion ICP1, and a first insulating structure BL1 may be formed on the first device layer DA1. The first insulating structure BL1 may include a stack structure of a SiCN film 152A, a TEOS film 154A, and a SiCN film 156A, which are sequentially stacked on the first device layer DA1. A second device layer DA2 may be formed on an active surface 120A of a second substrate 120 to form a second IC portion ICP2, and a second insulating structure BL2 may be formed on the second device layer DA2. The second insulating structure BL2 may include a stack structure of a SiCN film 152B, a TEOS film 154B, and a SiCN film 156B, which are sequentially stacked on the second device layer DA2.

Thereafter, the first IC portion ICP1 may be aligned with the second IC portion ICP2 in a vertical direction (Z direction) such that the first substrate 110 is located opposite to the second substrate 120 with the first device layer DA1 and the second device layer DA2 therebetween. After the first IC portion ICP1 is aligned with the second IC portion ICP2 in the vertical direction, the first insulating structure BL1 may be located opposite to the second insulating structure BL2.

Figure 15B:
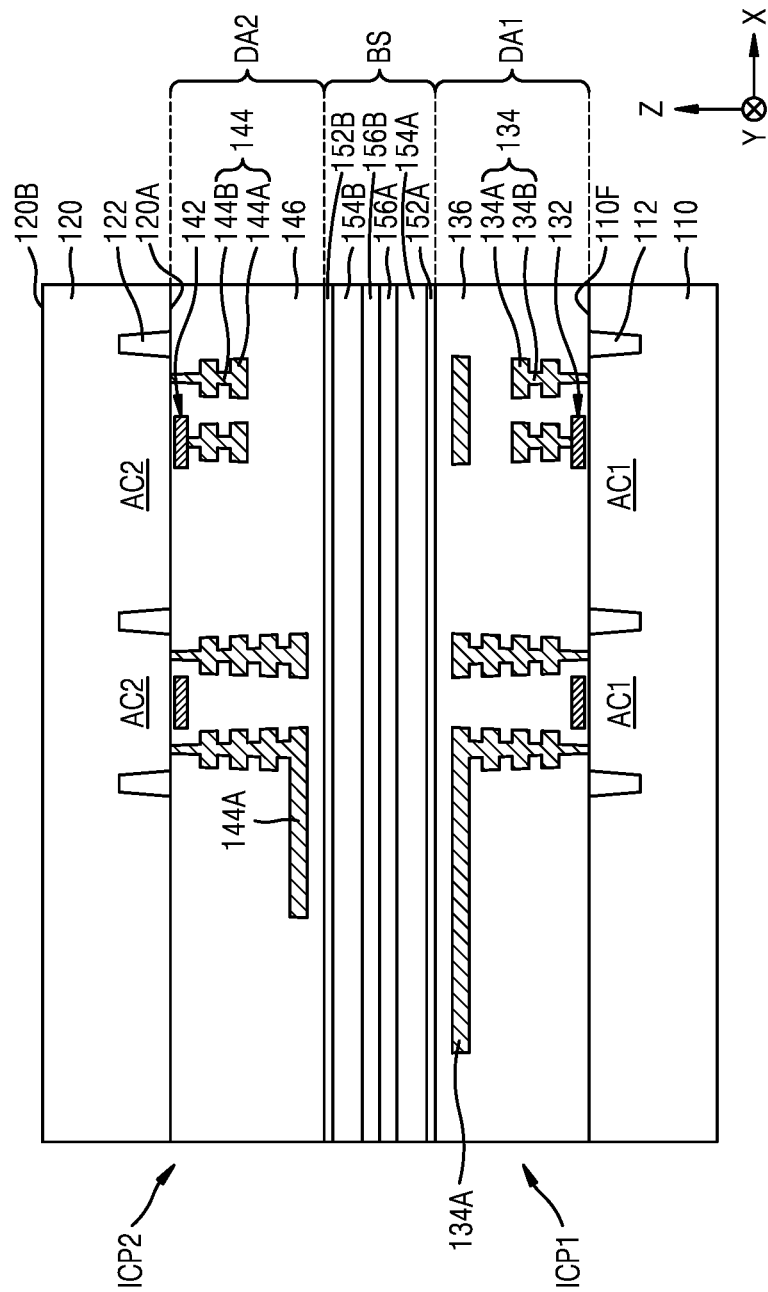

Referring to FIG. 15B, the SiCN film 156A formed on the first IC portion ICP1 may be brought into contact with the SiCN film 156B formed on the second IC portion ICP2, and an annealing process may be performed so that the SiCN film 156A and the SiCN film 156B may be bonded to each other. As a result, a SiCN—SiCN direct-bonded structure in which the SiCN film 156A and the SiCN film 156B are bonded to each other may be obtained. The annealing process may be performed at a temperature selected from a temperature range of about 180° C. to about 450° C.

While the SiCN film 156A and the SiCN film 156B are being bonded to each other, the first substrate 110 and the second substrate 120 may be applied with pressure to apply pressure to the SiCN film 156A and the SiCN film 156B. A plurality of SiCN films 152A, 152B, 156A, and 156B and a plurality of TEOS films 154A and 154B, which are interposed between the first device layer DA1 and the second device layer DA2, may constitute a bonding structure BS.

Figure 15C:
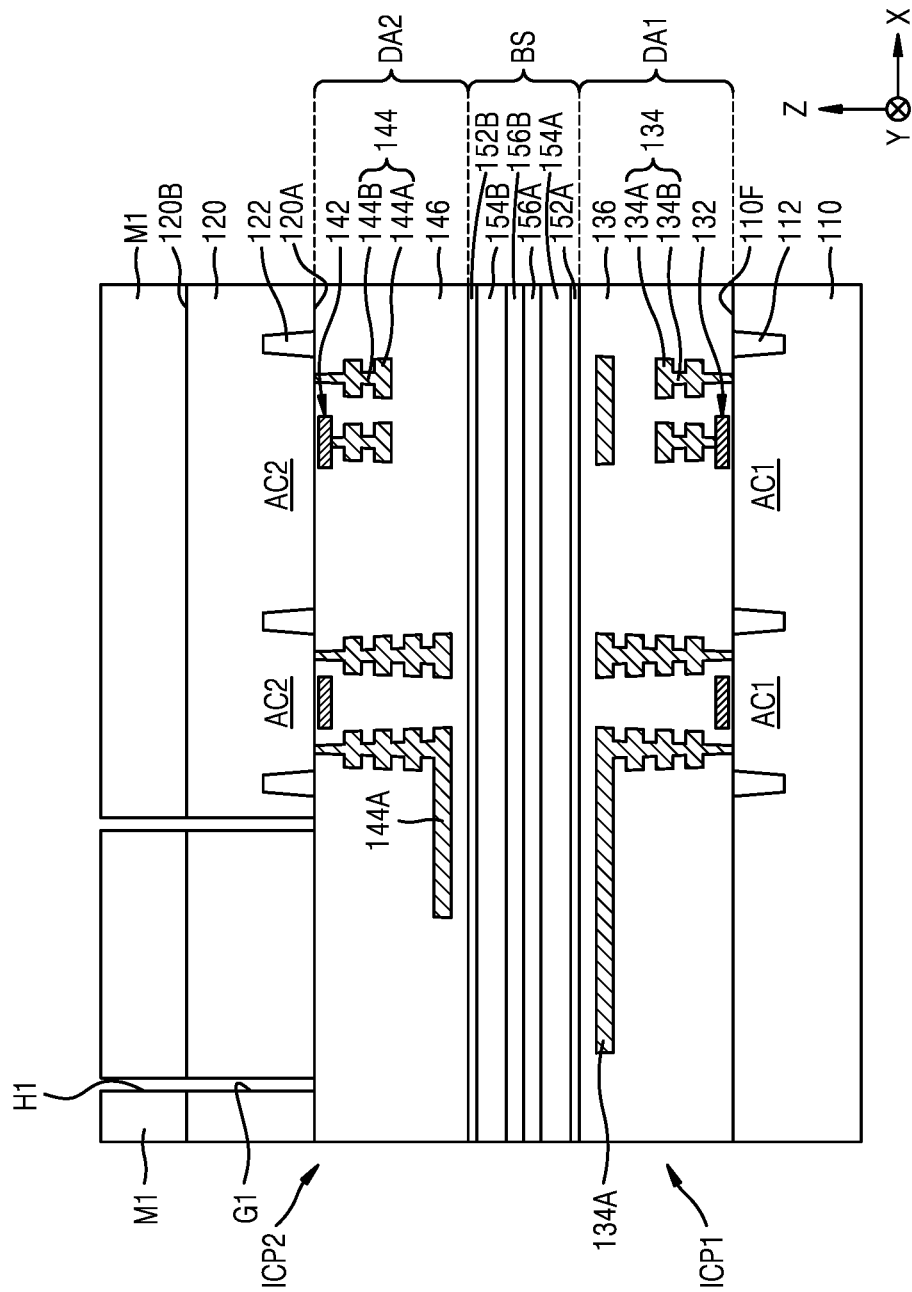

Referring to FIG. 15C, a first mask pattern M1 may be formed to cover a backside surface 120B of the second substrate 120. A first opening H1 having a ring-shaped planar structure may be formed in the first mask pattern M1. The first mask pattern M1 may include a photoresist pattern.

The second substrate 120 exposed through the first opening H1 may be anisotropically etched using the first mask pattern M1 as an etch mask, thereby forming a groove G1 exposing an interlayer insulating film 146. The groove G1 may have a ring-shaped planar structure.

Figure 15D:
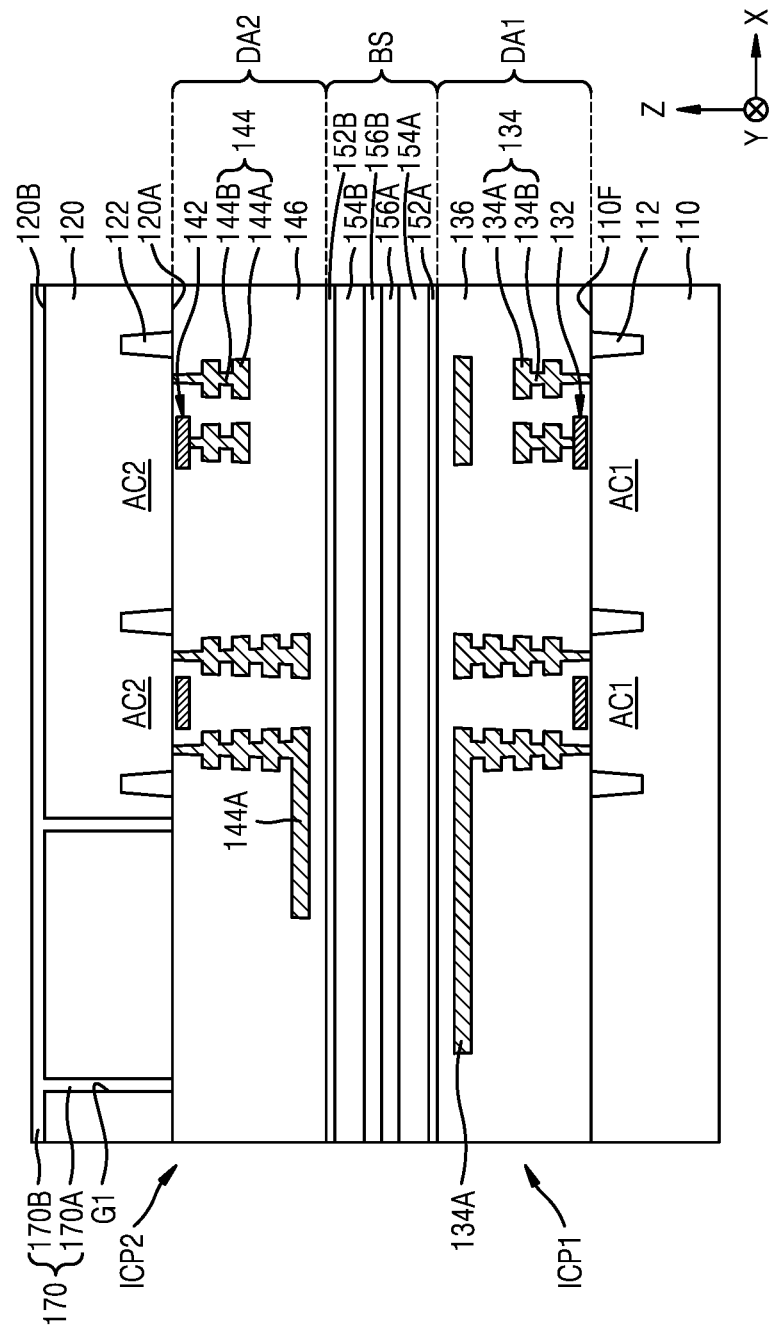

Referring to FIG. 15D, the first mask pattern M1 may be removed from the resultant structure of FIG. 15C, and an insulating film 170 may be formed to fill the groove G1 and cover the backside surface 120B of the second substrate 120. The insulating film 170 may include a through insulating portion 170A configured to fill the groove G1, and an insulating liner portion 170B configured to cover the backside surface 120B of the second substrate 120 outside the groove G1.

Figure 15E:
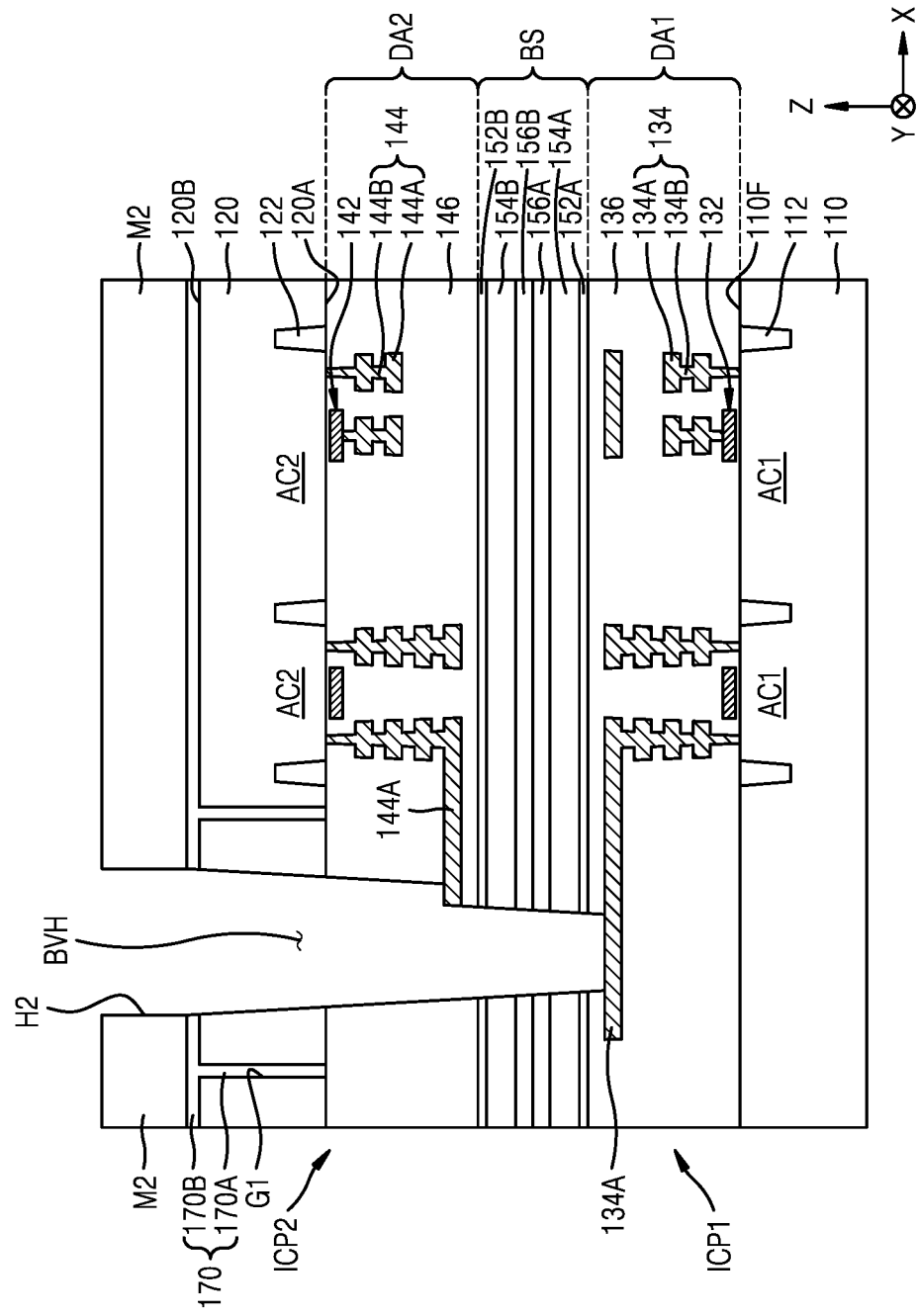

Referring to FIG. 15E, a second mask pattern M2 having a second opening H2 may be formed on the insulating film 170 in the resultant structure of FIG. 15D. The insulating liner portion 170B, which is exposed through the second opening H2, and the second substrate 120, the interlayer insulating film 146, and the bonding structure B S, which are located under the insulating liner portion 170B, may be etched using the second mask pattern M2 as an etch mask. Thereafter, a portion of the interlayer insulating film 136 may be etched to form a through hole BVH having a bottom surface exposing an interconnection layer 134A.

The second mask pattern M2 may include a photoresist pattern. The through hole BVH may be formed at a position apart from the through insulating portion 170A in a planar region defined by the through insulating portion 170A. The through hole BVH may be formed by an etching process, such as a dry etch. In some examples, the through hole BVH may be formed by one-time etching such that manufacturing process costs may be decreased.

Figure 15F:
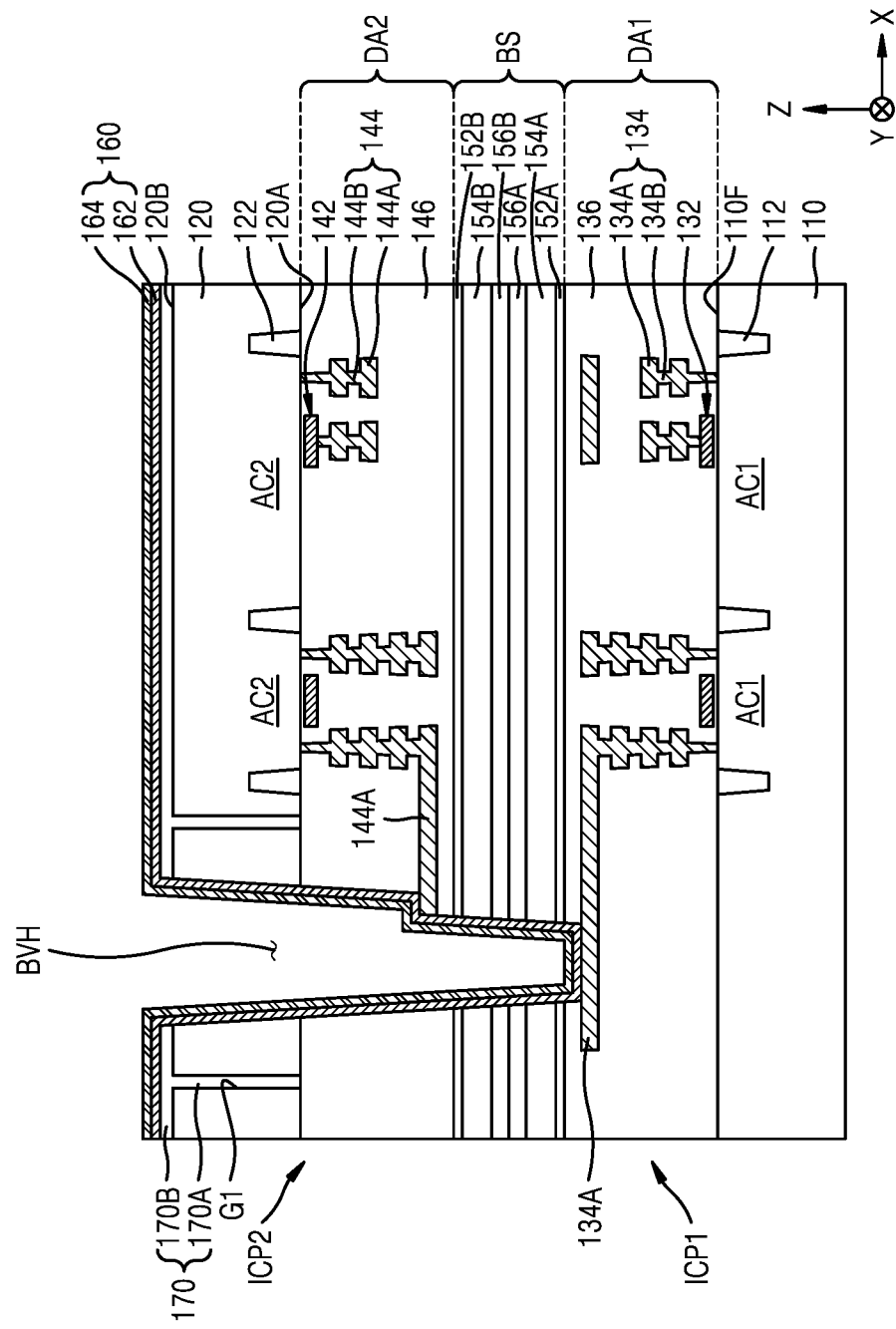

Referring to FIG. 15F, the second mask pattern M2 may be removed from the resultant structure of FIG. 15E, and a conductive layer 160 may be formed to cover an inner bottom surface and sidewall of the through hole BVH and a top surface of the insulating liner portion 170B.

The conductive layer 160 may include a lower conductive layer 162, which conformally covers the inner bottom surface and the sidewall of the through hole BVH and the top surface of the insulating liner portion 170B, and an upper conductive layer 164, which is located on the lower conductive layer 162 to conformally cover the lower conductive layer 162.

Figure 15G:
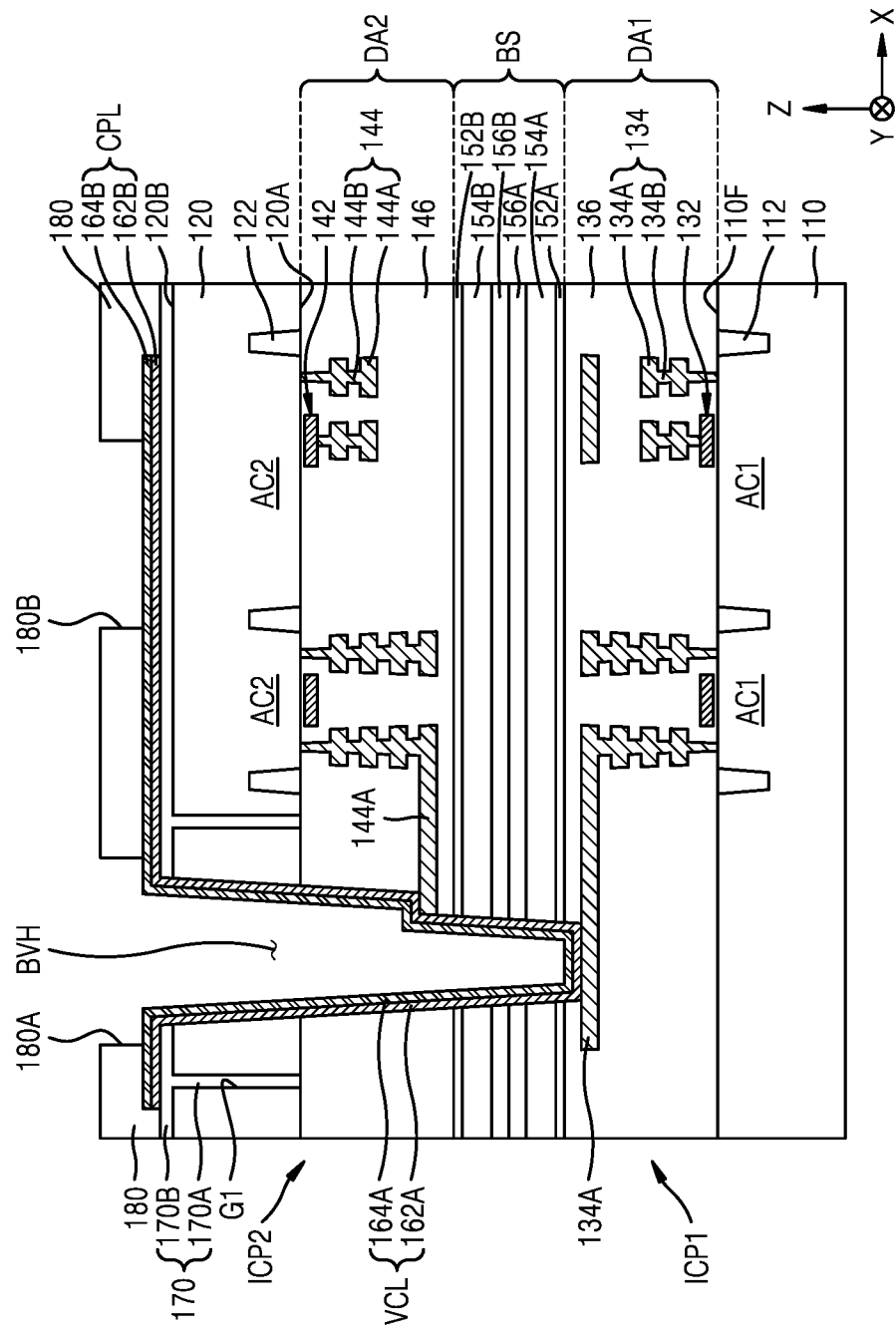

Referring to FIG. 15G, the conductive layer 160 may be patterned in the resultant structure of FIG. 15F to form a via contact liner VCL and a connection pad liner CPL. The via contact liner VCL may include a portion of the conductive layer 160, which remains inside the through hole BVH. The connection pad liner CPL may include a portion of the conductive layer 160, which remains on the backside surface 120B of the second substrate 120. The via contact liner VCL may include a first lower conductive layer 162A and a first upper conductive layer 164A, which include a portion of the lower conductive layer 162 and a portion of the upper conductive layer 164, respectively. The connection pad liner CPL may include a second lower conductive layer 162B and a second upper conductive layer 164B, which include another portion of the lower conductive layer 162 and another portion of the upper conductive layer 164, respectively.

Thereafter, a passivation pattern 180 may be formed on the connection pad liner CPL. The passivation pattern 180 may have a first opening 180A, which communicates with the through hole BVH, and a second opening 180B, which exposes a top surface of the connection pad liner CPL.

Figure 15H:
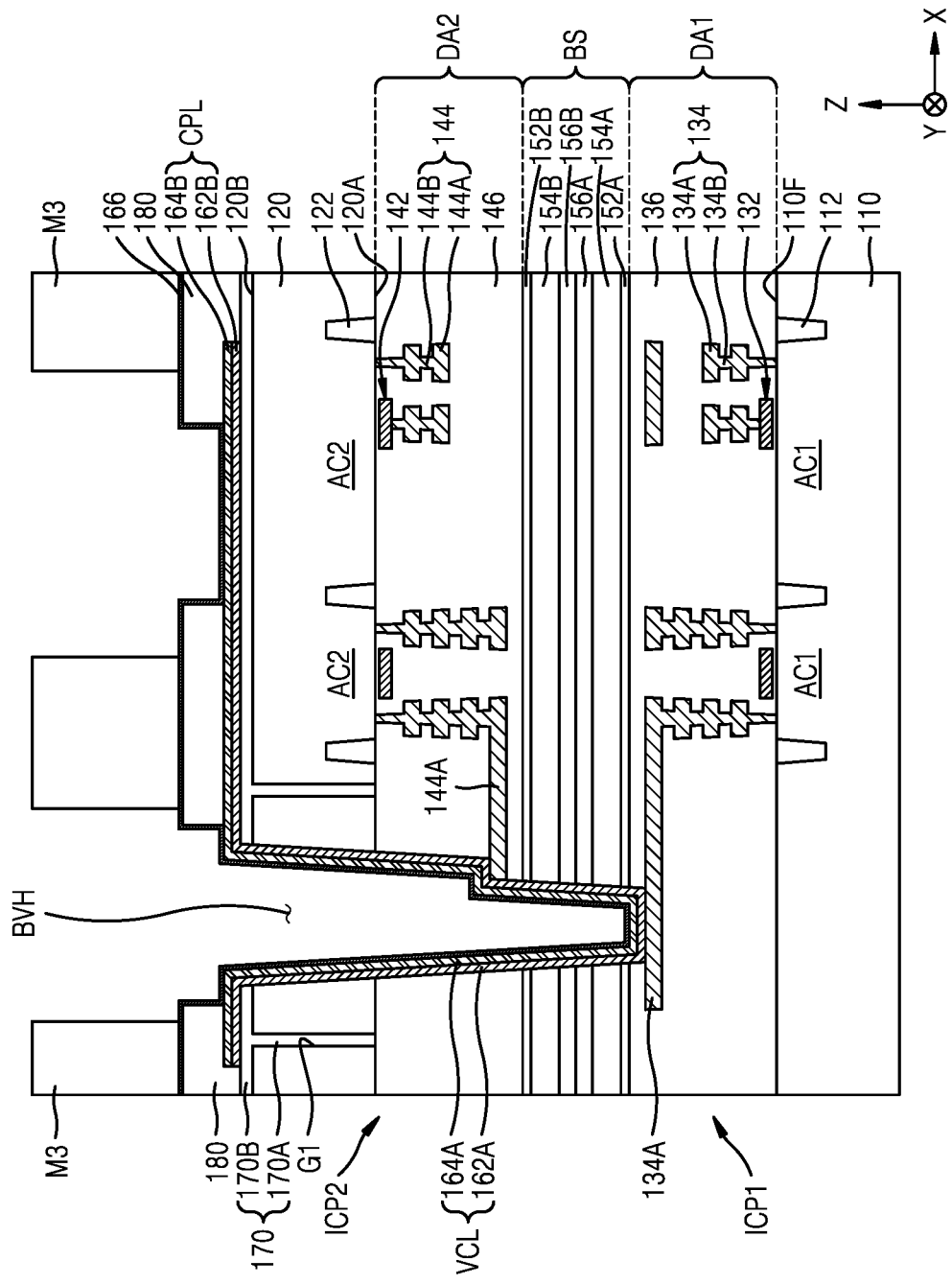
Figure 15I:
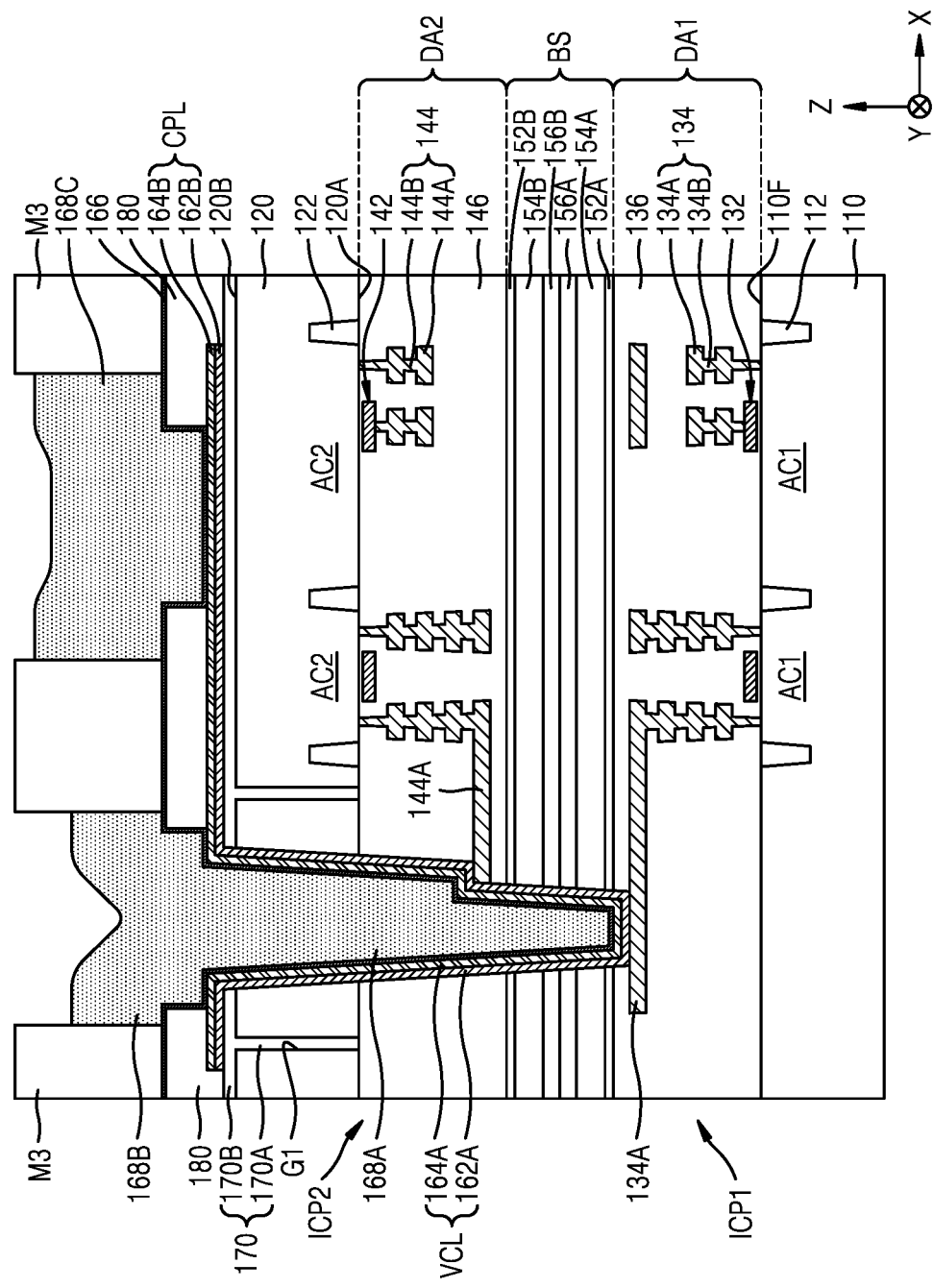

Referring to FIG. 15H, an under bump metallurgy (UBM) layer 166 may be formed to blanket cover a top surface of the resultant structure of FIG. 15G, and a third mask pattern M3 may be formed on the UBM layer 166. The third mask pattern M3 may include a plurality of openings defining regions in which a plurality of bumps will be formed. For example, the third mask pattern M3 may be formed on the UBM layer 166 and the third mask pattern M3 may not be formed in a region in which the plurality of openings are located.

The UBM layer 166 may be formed to cover the via contact liner VCL inside the through hole BVH and cover the connection pad liner CPL outside the through hole BVH. The UBM layer 166 may include Ti, W, TiW, or a combination thereof. The third mask pattern M3 may include a photoresist pattern.

Referring to FIG. 15I, an electroplating process may be performed on the resultant structure of FIG. 15H by using the UBM layer 166, which is exposed through the third mask pattern M3, as a seed layer. Thus, a first connection metal layer 168A, a second connection metal layer 168B, and a third connection metal layer 168C may be formed. The first connection metal layer 168A may cover the UBM layer 166 inside the through hole BVH. The second connection metal layer 168B may be integrally connected to the first connection metal layer 168A and protrude from the first connection metal layer 168A to the outside of the through hole BVH. The third connection metal layer 168C may cover the UBM layer 166 on the connection pad liner CPL. The first connection metal layer 168A, the second connection metal layer 168B, and the third connection metal layer 168C may be formed simultaneously using an electroplating process performed in the same space.

During the formation of the first connection metal layer 168A, the second connection metal layer 168B, and the third connection metal layer 168C, the first connection metal layer 168A and the second connection metal layer 168B may include portions formed using an electroplating process, which is performed on the UBM layer 166 located at a relatively low level inside the through hole BVH. The third connection metal layer 168C may be formed using an electroplating process, which is performed on the UBM layer 166 located at a relatively high level on the connection pad liner CPL outside the through hole BVH. For example, a top surface of the second connection metal layer 168B and a top surface of the third connection metal layer 168C may have different profiles. In some embodiments, the top surface of the second connection metal layer 168B and the top surface of the third connection metal layer 168C may be formed at a higher level than a top surface of the third mask pattern M3.

Figure 15J:
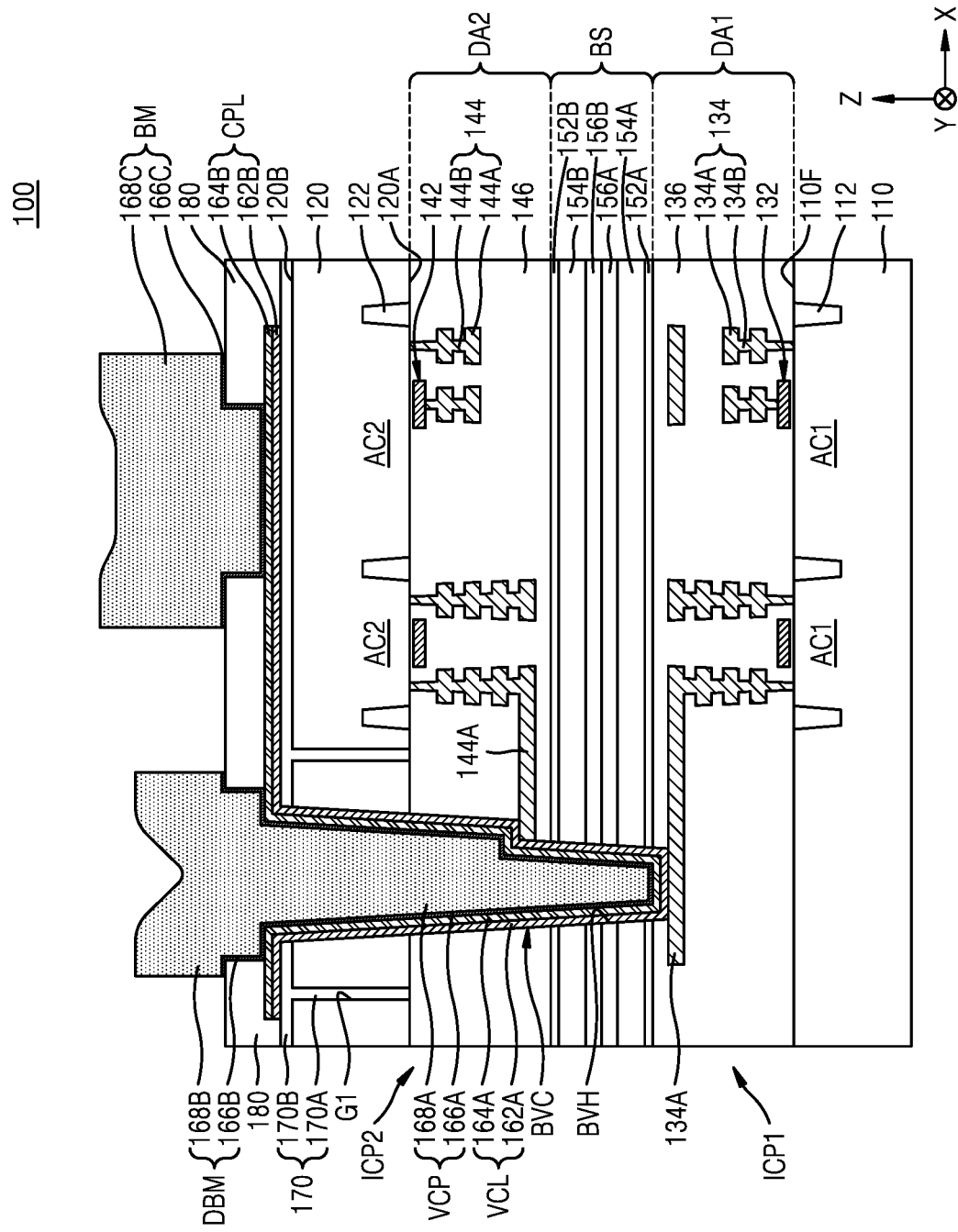

Referring to FIG. 15J, the third mask pattern M3 may be removed from the resultant structure of FIG. 15I using a lift-off process. In some examples, by using the lift-off process, a portion of the second and third connection metal layers 168B and 168C formed on the third mask pattern M3 may be simultaneously removed when the third mask pattern M3 is removed. Portions of the UBM layer 166, which are exposed after the third mask pattern M3 is removed, may be etched using the second connection metal layer 168B and the third connection metal layer 168C as an etch mask, thereby exposing a top surface of the passivation pattern 180 around the second connection metal layer 168B and the third connection metal layer 168C.

After the top surface of the passivation pattern 180 is exposed, a first UBM layer 166A included in a via contact plug VCP, a second UBM layer 166B included in a dummy bump structure DBM, and a third UBM layer 166C included in a bump structure BM may be obtained from the remaining portions of the UBM layer 166, which are not removed.

In the method of manufacturing the IC chip 100 according to the embodiments disclosed herein, the first connection metal layer 168A of the through-via contact portion BVC and the third connection metal layer 168C of the bump structure BM may be formed simultaneously. Thus, to form the first connection metal layer 168A of the through-via contact portion BVC and the third connection metal layer 168C of the bump structure BM, a separate mask pattern may not be used in addition to the third mask pattern M3. Accordingly, the manufacturing cost of the IC chip 100 may be reduced, and a process of manufacturing the IC chip 100 may be simplified.

While the method of manufacturing the IC chip 100 shown in FIGS. 1A and 1B has been described with reference to FIGS. 15A to 15J, various modifications and changes may be made without departing from the scope of the inventive concept, and it will be understood to one skilled in the art that the IC chips 200, 300, 400, 500, 600, 700, 800, 900, and 1000 shown in FIGS. 2 to 10 or various IC chips having structures similar thereto may be manufactured with reference to FIGS. 15A to 15J.

While the inventive concept has been particularly shown and described with reference to embodiments thereof, it will be understood that various changes in form and details may be made therein without departing from the spirit and scope of the following claims.

What is claimed is:

1. A method of manufacturing an integrated circuit chip, the method comprising:
    preparing an integrated circuit portion comprising a substrate and a device layer formed on an active surface of the substrate;
    forming a through hole from a bottom surface of the substrate, which is opposite to the active surface of the substrate, wherein the through hole passes through the substrate and the device layer;
    forming a via contact liner and a connection pad liner, wherein the via contact liner covers an inner wall of the through hole, and the connection pad liner is integrally connected to the via contact liner and extends along the bottom surface of the substrate in a lateral direction;
    forming an under bump metallurgy (UBM) layer to cover the via contact liner inside the through hole and cover the connection pad liner outside the through hole; and
    forming a first connection metal layer, a second connection metal layer, and a third connection metal layer, wherein the first connection metal layer covers the UBM layer inside the through hole, the second connection metal layer is integrally connected to the first connection metal layer and protrudes to the outside of the through hole, and the third connection metal layer is spaced apart from the second connection metal layer in the lateral direction and covers the UBM layer on the connection pad liner,
    wherein the via contact liner and the connection pad liner are conductive liners, and
    wherein the third connection metal layer is electrically connected to the second connection metal layer through the connection pad liner.

2. The method of claim 1, wherein the first connection metal layer and the third connection metal layer are formed simultaneously.

3. The method of claim 1, wherein each of the first connection metal layer, the second connection metal layer, and the third connection metal layer comprises gold (Au).

4. The method of claim 1, wherein during the forming of the via contact liner and the connection pad liner, the via contact liner is formed to be in contact with at least one interconnection layer included in the device layer.

5. A method of manufacturing an integrated circuit chip, the method comprising:
    preparing a first integrated circuit portion comprising a first substrate and a first device layer formed on an active surface of the first substrate;
    preparing a second integrated circuit portion comprising a second substrate and a second device layer formed on an active surface of the second substrate;
    bonding the first integrated circuit portion and the second integrated circuit portion to each other such that the first substrate is located opposite to the second substrate with the first device layer and the second device layer therebetween;
    forming a through hole from a bottom surface of the second substrate, the bottom surface being opposite to the active surface of the second substrate, wherein the through hole passes through the second substrate and the first device layer and exposes at least one first interconnection layer included in the first device layer;
    forming a via contact liner and a connection pad liner, wherein the via contact liner covers an inner wall of the through hole, and the connection pad liner is integrally connected to the via contact liner and extends along the bottom surface of the second substrate in a lateral direction;
    forming an under bump metallurgy (UBM) layer to cover the via contact liner inside the through hole and cover the connection pad liner outside the through hole; and
    forming a first connection metal layer, a second connection metal layer, and a third connection metal layer, wherein the first connection metal layer covers the UBM layer inside the through hole, the second connection metal layer is integrally connected to the first connection metal layer and protrudes to the outside of the through hole, and the third connection metal layer is spaced apart from the second connection metal layer and covers the UBM layer on the connection pad liner,
    wherein the via contact liner and the connection pad liner are conductive liners, and
    wherein the third connection metal layer is electrically connected to the second connection metal layer through the connection pad liner.

6. The method of claim 5, wherein the bonding of the first integrated circuit portion and the second integrated circuit portion to each other is performed using a bonding structure between the first device layer and the second device layer, and
    wherein, during the forming of the through hole, the through hole is formed to pass through the bonding structure.

7. The method of claim 5, wherein during the forming of the via contact liner and the connection pad liner, the via contact liner is formed to be in contact with at least one of the at least one first interconnection layer included in the first device layer and a second interconnection layer included in the second device layer.

8. The method of claim 5, wherein the preparing of the first integrated circuit portion comprises forming a logic device, and
    wherein the preparing of the second integrated circuit portion comprises forming an analog device.

* * * * *